United States Patent
Hyun et al.

(10) Patent No.: US 10,468,092 B2
(45) Date of Patent: *Nov. 5, 2019

(54) MEMORY DEVICE FOR CONTROLLING REFRESH OPERATION BY USING CELL CHARACTERISTIC FLAGS

(71) Applicant: Samsung Electronics Co., Ltd., Suwon-si, Gyeonggi-do (KR)

(72) Inventors: Ki-ho Hyun, Hwaseong-si (KR); Kyo-min Sohn, Yongin-si (KR); Je-min Ryu, Seoul (KR); Ho-Seok Seol, Daejeon (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/288,626

(22) Filed: Feb. 28, 2019

(65) Prior Publication Data
US 2019/0198087 A1 Jun. 27, 2019

Related U.S. Application Data

(63) Continuation of application No. 14/956,792, filed on Dec. 2, 2015, now Pat. No. 10,242,731.

(30) Foreign Application Priority Data

Dec. 8, 2014 (KR) .................. 10-2014-0175375

(51) Int. Cl.
*G11C 11/408* (2006.01)
*G11C 11/406* (2006.01)
*G11C 11/4093* (2006.01)

(52) U.S. Cl.
CPC ..... *G11C 11/4087* (2013.01); *G11C 11/40611* (2013.01); *G11C 11/40622* (2013.01); *G11C 11/4093* (2013.01); *G11C 2211/4061* (2013.01)

(58) Field of Classification Search
CPC .................. G11C 11/4087; G11C 11/40611
USPC ..................................................... 365/189.05
See application file for complete search history.

(56) References Cited

U.S. PATENT DOCUMENTS

| | | | |
|---|---|---|---|
| 6,167,484 A | 12/2000 | Boyer et al. | |
| 7,187,607 B2 | 3/2007 | Koshikawa | |
| 7,558,102 B2 | 7/2009 | Shore | |
| 7,650,337 B2 | 1/2010 | Cox | |
| 7,813,194 B2 | 10/2010 | Martin et al. | |
| 7,952,950 B2 | 5/2011 | Miyatake et al. | |
| 7,983,105 B2 | 7/2011 | Ogishima | |
| 8,023,347 B2 | 9/2011 | Chu et al. | |
| 8,325,547 B2 | 12/2012 | Fujisaki | |
| 8,412,882 B2 | 4/2013 | Zorn et al. | |
| 8,732,434 B2 | 5/2014 | Hwang et al. | |
| 8,873,324 B2 | 10/2014 | Park et al. | |
| 9,042,194 B2 | 5/2015 | Park et al. | |
| 9,053,813 B2 | 6/2015 | Kang et al. | |

(Continued)

*Primary Examiner* — Hoai V Ho
*Assistant Examiner* — Muna A Techane
(74) *Attorney, Agent, or Firm* — Harness, Dickey & Pierce, P.L.C.

(57) ABSTRACT

A memory device includes a memory cell array that includes a plurality of memory cell rows; and a refresh address generator configured to store flags respectively corresponding to the plurality of memory cell rows, generate refresh row addresses respectively corresponding to the plurality of memory cell rows by performing a count operation, and according to the flags, change a refresh period of the plurality of memory cell rows.

20 Claims, 17 Drawing Sheets

(56) References Cited

U.S. PATENT DOCUMENTS

| | | |
|---|---|---|
| 2004/0034735 A1 | 2/2004 | Winograd et al. |
| 2005/0229077 A1 | 10/2005 | Takahashi |
| 2005/0262104 A1 | 11/2005 | Robertson et al. |
| 2009/0059682 A1 | 3/2009 | Park et al. |
| 2011/0292710 A1 | 12/2011 | Matsubayashi et al. |
| 2012/0300568 A1 | 11/2012 | Park et al. |
| 2013/0159617 A1 | 6/2013 | Yu et al. |
| 2013/0223171 A1 | 8/2013 | Kim et al. |
| 2014/0169114 A1 | 6/2014 | Oh |

MEMORY DEVICE FOR CONTROLLING REFRESH OPERATION BY USING CELL CHARACTERISTIC FLAGS

CROSS-REFERENCE TO RELATED APPLICATION

This U.S. non-provisional patent application is a continuation of U.S. application Ser. No. 14/956,792, filed on Dec. 2, 2015, which claims the benefit of Korean Patent Application No. 10-2014-0175375, filed on Dec. 8, 2014, in the Korean Intellectual Property Office, the disclosures of each of which are incorporated herein in their entirety by reference.

BACKGROUND

At least one example embodiment of the inventive concepts relates to a semiconductor memory device, and more particularly, to a semiconductor memory device for controlling a refresh operation by using cell characteristic flags and a refresh method of the semiconductor memory device.

A volatile memory device such as dynamic random access memory (DRAM) performs a refresh operation to maintain stored data. In the case that a DRAM memory cell has a shorter data retention time than a standard refresh period, refresh leveraging for adjusting a refresh period of a weak cell is performed to revive the weak cell. Information about the weak cell to which refresh leveraging is performed is stored in the same storage space as an anti-fuse array. The size of the storage space may cause a chip size overhead problem in a memory device.

SUMMARY

At least one example embodiment of the inventive concepts provide a memory device for controlling a refresh operation by using cell characteristic flags to solve a chip size overhead problem and reduce power consumption.

At least one example embodiment of the inventive concepts provide a refresh method of the memory device using cell characteristic flags to solve the chip size overhead problem and reduce power consumption.

According to at least one example embodiment of the inventive concepts, a memory device includes a memory cell array that includes a plurality of memory cell rows; and a refresh address generator configured to store flags respectively corresponding to the plurality of memory cell rows, generate refresh row addresses respectively corresponding to the plurality of memory cell rows by performing a count operation, and according to the flags, change a refresh period of the plurality of memory cell rows.

The refresh address generator may be configured to determine each of the plurality of memory cell rows to be a normal cell row or a weak cell row according to at least one bit of the flags.

The refresh address generator may be configured to refresh the normal cell row according to the refresh period, and refresh the weak cell row according to a shorter period than the refresh period.

The refresh address generator may be configured to determine each of the plurality of memory cell rows to be a normal cell row or a strong cell row according to at least one bit of the flags.

The refresh address generator may be configured to refresh the normal cell row according to the refresh period, and refresh the strong cell row according to a longer period than the refresh period.

The refresh address generator may be configured to determine each of the plurality of memory cell rows to be a normal cell row, a weak cell row, or a strong cell row according to at least two bits of the flags.

The refresh address generator may be configured to refresh the normal cell row according to the refresh period, refresh the weak cell row according to a period shorter than the refresh period, and refresh the strong cell row according to a period longer period than the refresh period.

The refresh address generator may include a counter configured to generate normal cell row addresses respectively corresponding to the memory cell rows by performing the count operation; a storage that includes storage cells that store the flags respectively corresponding to the plurality of memory cell rows; a decoder configured to address the storage cells based on the refresh row addresses; a latch configured to store the normal cell row addresses corresponding to the flags output from the storage as weak cell row addresses or strong cell row addresses; and a selector configured to output the weak cell row addresses, the strong cell row addresses, or the normal cell row addresses as the refresh row addresses, according to the changed refresh period, the normal cell row addresses being row addresses other than the weak and strong cell row addresses.

Each of the storage cells may store the flags as 1-bit information.

Each of the storage cells may store the flags as 2-bit information.

The storage cells may be configured such that each of the storage cells stores the flags before the memory device is packaged.

The storage cells may be configured such that each of the storage cells stores the flags after the memory device is packaged.

The storage cells may be non-volatile memory and include at least one of electric programmable fuse memory, laser-programmable fuse memory, anti-fuse memory, one-time programmable memory, or flash memory.

The refresh address generator may further include a sense amplifier configured to sense-amplifies the flags output from the storage.

According to at least one example embodiment, a memory device includes a memory cell array that includes a plurality of memory cell rows corresponding to a plurality of row addresses, respectively; and a refresh address generator configured to store a plurality of flags, the plurality of flags corresponding to the plurality of row addresses, respectively, determine a type, from among a plurality of types, of a first row address, from among the plurality of row addresses, the plurality of types including at least a first type and a second type, refresh a first memory cell row at a first rate, when the determined type is the first type, the first memory cell row being the memory cell row, from among the plurality of memory cell rows, that corresponds to the first memory row address, and refresh the first memory cell row at a second rate higher than the first rate, when the determined type is the second type, The refresh address generator may be configured such that the determination is based on the flag, from among the plurality of flags, that correspond to the first row address.

BRIEF DESCRIPTION OF THE DRAWINGS

The above and other features and advantages of example embodiments of the inventive concepts will become more apparent by describing in detail example embodiments of the inventive concepts with reference to the attached drawings. The accompanying drawings are intended to depict example embodiments of the inventive concepts and should not be interpreted to limit the intended scope of the claims. The accompanying drawings are not to be considered as drawn to scale unless explicitly noted.

DETAILED DESCRIPTION OF THE EMBODIMENTS

Figure 1:
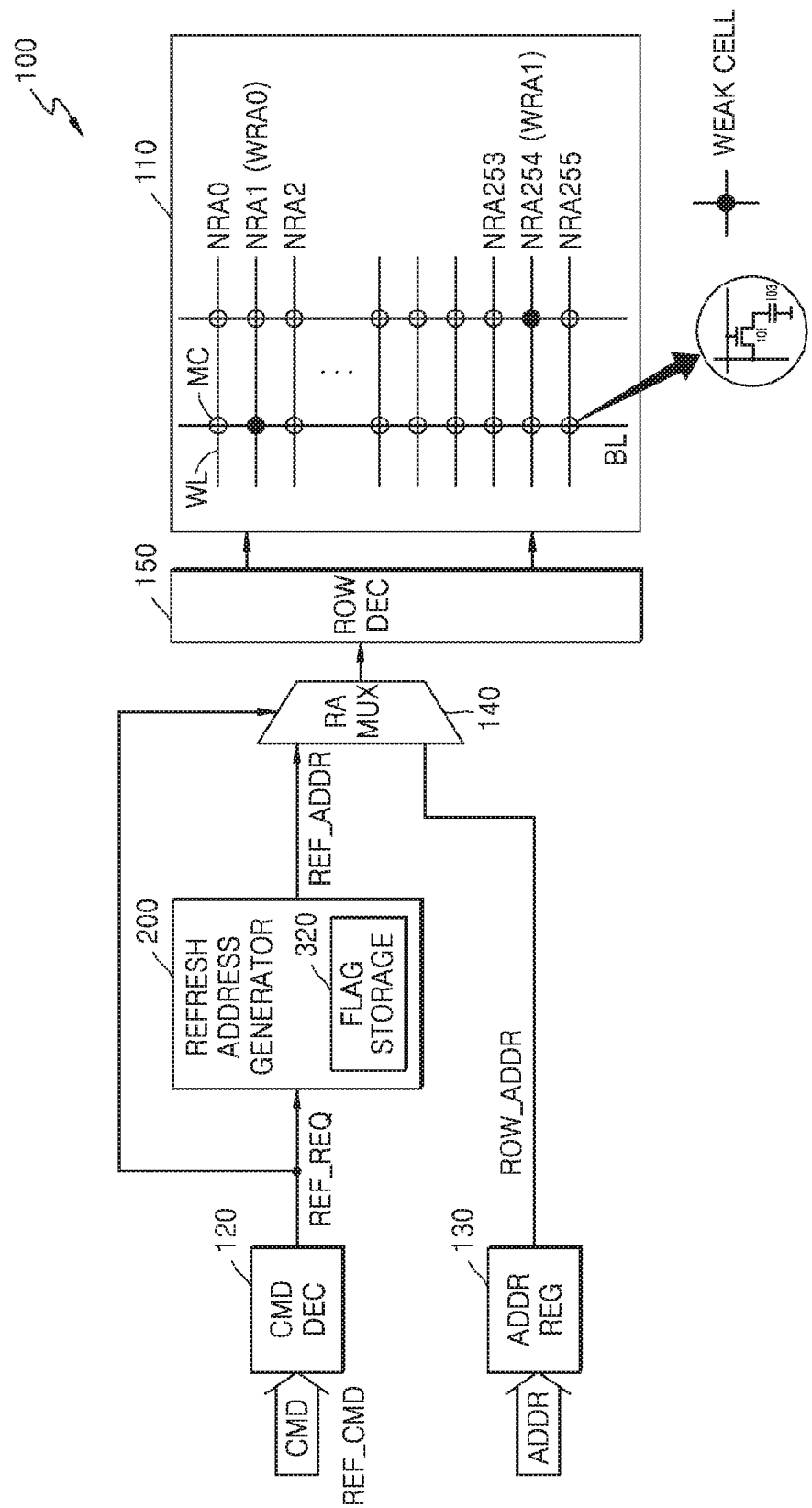
FIG. 1 is a diagram for describing a memory device that performs a refresh operation by using a weak cell flag, according to at least one example embodiment of the inventive concepts.

Detailed example embodiments of the inventive concepts are disclosed herein. However, specific structural and functional details disclosed herein are merely representative for purposes of describing example embodiments of the inventive concepts. Example embodiments of the inventive concepts may, however, be embodied in many alternate forms and should not be construed as limited to only the embodiments set forth herein.

Accordingly, while example embodiments of the inventive concepts are capable of various modifications and alternative forms, embodiments thereof are shown by way of example in the drawings and will herein be described in detail. It should be understood, however, that there is no intent to limit example embodiments of the inventive concepts to the particular forms disclosed, but to the contrary, example embodiments of the inventive concepts are to cover all modifications, equivalents, and alternatives falling within the scope of example embodiments of the inventive concepts. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the inventive concepts. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments of the inventive concepts. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments of the inventive concepts are described herein with reference to schematic illustrations of idealized embodiments (and intermediate structures) of the inventive concepts. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

A semiconductor memory device, for example, dynamic random access memory (DRAM) has finite data retention. As the DRAM continues process scaling, a capacitance value of a cell capacitor may decrease. Accordingly, a bit error rate (BER) may be increased and decrease the reliability of data stored in a memory cell. In order to prevent this BER increase, the DRAM performs a refresh operation to maintain the data stored in the memory cell.

More memory cells, which have a shorter data retention time than a standard DRAM refresh period, are being included in memory cells. In order to revive such weak cells, a refresh leveraging operation may be performed. The refresh leveraging operation may be set to refresh weak cell rows in between normal refresh operations that are performed to refresh the memory cell rows according to a refresh period. During the refresh period, the normal refresh operations include sequentially refreshing each of the memory cell rows once, and the refresh leveraging operation includes refreshing the weak cell rows at least once.

Address information of the weak cell rows may be stored in an address storage including non-volatile memory such as an anti-fuse array. Each weak cell row address bit corresponds to a single anti-fuse. The address storage may be configured to store the weak cell row address bits by opening or short-circuiting corresponding anti-fuses. The address storage may require many anti-fuse arrays to store all the weak cell row address bits. Furthermore, since much more anti-fuse arrays are necessary when there are a large number of weak cell rows, the size of the address storage may be a significant burden on a chip size of the DRAM. At least some example embodiments of the inventive concepts provide a memory device that controls a refresh operation and is less affected by a chip size problem due to the storage space for storing weak cell row addresses.

FIG. 1 is a diagram for describing a memory device 100 that performs a refresh operation by using a weak cell flag, according to at least one example embodiment of the inventive concepts.

Referring to FIG. 1, the memory device 100 includes a memory cell array 110, a command decoder 120, an address register 130, a row address multiplexer 140, a row decoder 150, and a refresh address generator 200.

The memory cell array 110 may include a plurality of memory cells MCs arranged in rows and columns. A plurality of word lines WL in a row direction and a plurality of bit lines BL in a column direction perpendicularly cross each other and form a matrix. The memory cells MCs form an arrangement structure in which a memory cell MC is at each intersection of the matrix. Each of the memory cells MC may be formed of an access transistor 101 and a storage capacitor 103 A gate of the access transistor 101 may be connected to the word line WL and a drain of the access transistor 101 may be connected to the bit line BL.

The memory cell array 110 may include a plurality of memory cell rows NRAs. The memory cell rows NRA are rows of the memory cells MCs connected to the word lines WL. For convenience of description, the memory cell array 110 may include, for example, 256 word lines WLs corresponding to memory cell rows NRA0 to NRA255. However, according to at least some example embodiments, a total number of word lines WL and/or memory cell rows may be more or less than 256. In the memory cell array 110, the first memory cell row is referred to as "NRA0," a memory cell row increased by "1" by a refresh counter is referred to as "NRA1," and the 256th memory cell row is referred to as "NRA255." Accordingly, with respect to an example where a total number of word lines WL is 256, the 256th memory cell row (i.e., memory cell row NRA255) is the maximum (i.e., highest-numbered) memory cell row. Thus, according to at least some example embodiments, the maximum memory cell row refers to a highest-numbered memory cell row, and is based on a total number of memory cell rows and/or word lines WL in the memory cell array 110. A refresh operation may include sequentially refreshing the memory cell rows NRA0, NRA1, NRA2, . . . , NRA253, NRA254, and then lastly, refreshing the 256th memory cell row NRA255. The memory cell rows NRA0 to NRA255 may be refreshed according to a desired or, alternatively, predetermined refresh period.

The command decoder 120 may receive a command CMD from a memory controller and decode the command CMD. The command decoder 120 may generate control signals corresponding to the command CMD by decoding a write enable signal (/WE), a row address strobe signal (/RAS), a column address strobe signal (/CAS), and a chip selecting signal (/CS). In response to a refresh command REF_CMD, the command decoder 120 may generate a refresh request signal REF_REQ for requesting the refresh address generator 200 to generate a refresh row address REF_ADDR for refreshing. The refresh request signal REF_REQ may be generated as desired or, alternatively, predetermined pulses having refresh time intervals (tRFC) in response to the refresh command REF_CMD, and during the pulse duration, the refresh address generator 200 may perform a count operation.

The address register 130 may receive an address ADDR that includes a row address ROW_ADDR and a column address from the memory controller. The address register 130 may provide the received row address ROW_ADDR to the row address multiplexer 140, and provide the received column address to a column decoder. The column decoder may activate a sense amplifier that corresponds to the column address. Data read from the memory cell array 110 may be sense-amplified by the sense amplifier, and provided to the memory controller via a data input/output (I/O) buffer.

The row address multiplexer 140 may receive the row address ROW_ADDR from the address register 130 and receive the refresh row address REF_ADDR from the refresh address generator 200. The row address multiplexer 140 may select and output the refresh row address REF_ADDR in response to the refresh request signal REF_REQ. A row address output from the row address multiplexer 140 may be provided to the row decoder 150.

The row decoder 150 may decode the row address output from the row address multiplexer 140, and activate one of the memory cell rows NRA0 to NRA255 which corresponds to the row address. According to the present embodiment, the row decoder 150 may decode the refresh row address REF_ADDR to perform the refresh operation, and refresh each of the memory cell rows NRA0 to NRA255. According to at least one example embodiment of the inventive concepts, the row decoder 150 may decode the row address ROW_ADDR and selectively activate the memory cell rows NRA0 to NRA255 to perform a read operation or a write operation.

Suppose that in the memory cell array 110, weak cell rows that include at least one weak cell among the memory cell rows NRA0 to NRA255 are the memory cell rows NRA1 and NRA254. Hereinafter, the memory cell row NRA1 is referred to as a first weak cell row WRA0, and the memory cell row NRA254 is referred to as a second weak cell row WRA1. Also, the memory cell rows NRA0 to NRA255, are referred to as normal cell rows. Although the memory cell array 110 includes two weak cell rows (WRA0 and WRA1) in the memory cell array 110 according to the present example shown in FIG. 1, the number of weak cell rows may vary.

The memory device 100 performs the refresh operation to maintain data stored in the memory cell MC. The refresh address generator 200 may generate refresh row addresses REF_ADDR such that the memory cells MCs connected to the normal cell rows NRA0 to NRA255 are refreshed according to a refresh period tRP, and the memory cells MCs connected to the first and second weak cell rows WRA0 and WRA1 are refreshed according to a shorter period than the refresh period tRP.

The refresh address generator 200 may include a flag storage 320 that stores weak cell flags that respectively correspond to the memory cell rows NRA0 to NRA255 and indicate whether a corresponding memory cell row is a weak cell row. The flag storage 320 may include storage cells that store the weak cell flags with respect to the memory cell rows NRA0 to NRA255. Since the number of storage cells of the flag storage 320 corresponds to the number of memory cell rows NRA0 to NRA255, the flag storage 320 according to the present embodiment may include 256 storage cells.

Each of the storage cells of the flag storage 320 may include a 1-bit weak cell flag. Since the memory cell rows NRA1 and NRA254 are the first and second weak cell rows WRA0 and WRA1 among the memory cell rows NRA0 to NRA255, each of storage cells that respectively correspond to the memory cell rows NRA1 and NRA254 may store a 1-bit weak cell flag. The memory cell rows NRA1 and NRA254 that match with the weak cell flags, i.e., the first and second weak cell rows WRA0 and WRA1, may be refreshed according to a shorter period than the refresh period tRP.

According to at least one example embodiment of the inventive concepts, the storage cells of the flag storage 320 may include 1-bit storage cells that store strong cell flags with respect to the memory cell rows NRA0 to NRA255. Memory cell rows that match with strong cell flags among the memory cell rows are strong cell rows, and the strong cell rows may be refreshed according to a longer period than the refresh period tRP.

According to at least one example embodiment of the inventive concepts, the storage cells of the flag storage 320 may include 2-bit strong cells that store a weak cell flag or a strong cell flag with respect to the memory cell rows NRA0 to NRA255. Among the memory cell rows NRA0 to NRA255 the weak cell rows that match with the weak cell flags may be refreshed according to a shorter period than the refresh period tRP and the strong cell rows that match with the strong cell flags may be refreshed according to a period than longer the refresh period tRP.

The refresh address generator 200 may generate the refresh row addresses REF_ADDR that respectively correspond to the memory cell rows NRA0 to NRA255 by performing a count operation according to the refresh request signal REF_REQ. The refresh address generator 200 may monitor the refresh row addresses REF_ADDR that are output whenever the count operation is performed and corresponding weak cell flags stored in the flag storage 320.

Based on the monitoring result, when one of the refresh row addresses REF_ADDR matches with the weak cell flag, the refresh address generator 200 may store that refresh row address REF_ADDR as a weak cell row address. The refresh row addresses REF_ADDR, which are output whenever the count operation is performed by the refresh address generator 200, may be referred to as normal cell row addresses.

The refresh address generator 200 may refresh the memory cells MCs connected to the normal cell rows NRA0 to NRA255 to which the normal cell row addresses are addressed, according to the refresh period tRP. The refresh address generator 200 may refresh the memory cells MCs connected to the first and second weak cell rows WRA0 and WRA1 to which weak cell row addresses are assigned, according to a shorter period than the refresh period tRP.

Figure 2:
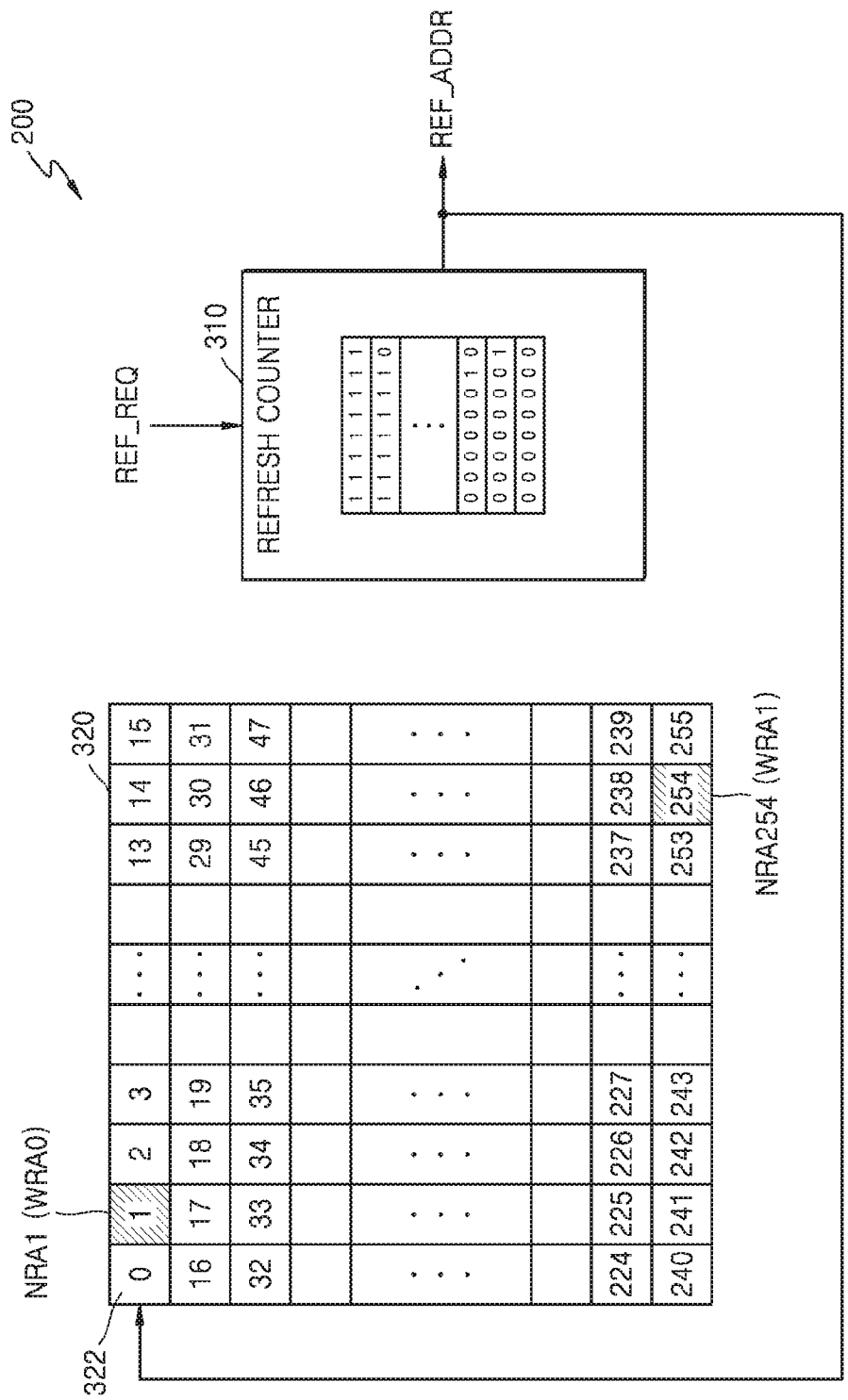
FIG. 2 is a diagram for describing operations of a refresh address generator of FIG. 1.

FIG. 2 is a diagram for describing operations of the refresh address generator 200 of FIG. 1. According to at least one example embodiment, the address generator 200 may be implemented by hardware, software, or a combination of software and hardware. For example, according to at least one example embodiment, the address generator 200 may be implemented by circuitry or a circuit structured to perform any or all of the operations described herein as being performed by the address generator 200. Further, according to at least one example embodiment, the address generator 200 may be implemented by a processor (e.g., a processor included in memory device 100) executing instructions corresponding to any or all of the operations described herein as being performed by the address generator 200.

The term 'processor', as used herein, may refer to, for example, a hardware-implemented data processing device having circuitry that is physically structured to execute desired operations including, for example, operations represented as code and/or instructions included in a program. Examples of the above-referenced hardware-implemented data processing device include, but are not limited to, a microprocessor, a central processing unit (CPU), a processor core, a multi-core processor; a multiprocessor, an application-specific integrated circuit (ASIC), and a field programmable gate array (FPGA).

Referring to FIGS. 1 and 2, the refresh address generator 200 may include a refresh counter 310 and the flag storage 320. In response to the refresh request signal REF_REQ, the refresh counter 310 may perform a count operation and thus generate the refresh row address REF_ADDR. The flag storage 320 may store a weak cell flag that corresponds to the refresh row address REF_ADDR.

The refresh counter 310 may initialize a count output value and thus initialize the refresh row address REF_ADDR. The refresh counter 310 may output the refresh row address REF_ADDR that gradually increases by performing the count operation. The refresh row address REF_ADDR may respectively correspond to the memory cell rows NRA0 to NRA255 of the memory cell array 110. The refresh counter 310 may initialize the refresh row address REF_ADDR when the output refresh row address REF_ADDR is greater than an address of the 256th memory cell row NRA255.

The refresh row address REF_ADDR of the refresh counter 310 may correspond to a cell selected from storage cells 322 of the flag storage 320. When a weak cell row is detected during a test in one of the manufacturing processes of the memory device 100, a weak cell flag may be stored in a cell selected from the storage cells 322 of the flag storage 320, i.e., the cell that corresponds to a refresh row address REF_ADDR of a memory cell row determined as the weak cell row. According to at least one example embodiment of the inventive concepts, weak cell flags may be stored in storage cells (boxes shaded with diagonal lines) that correspond to the memory cell rows NRA1 and NRA255 of the memory cell array 110.

According to at least one example embodiment of the inventive concepts, when a strong cell row is detected during a test in one of the manufacturing process, a strong cell flag may be stored in a cell selected from the storage cells 322 of the flag storage 320, i.e., the cell that corresponds to a refresh row address REF_ADDR of a memory cell row determined as the strong cell row.

The storage cells 322 in the flag storage 320 may be arranged in, for example, 16 rows and 16 columns. The flag storage 320 may be various types of non-volatile memory, for example, electric programmable fuse memory, laser-programmable fuse memory, anti-fuse memory, one-time programmable memory, and flash memory. When the flag storage 320 is anti-fuse memory, the storage cells 322 of a first row of the flag storage 320 may be formed as an anti-fuse array, as shown in FIG. 3.

Figure 3:
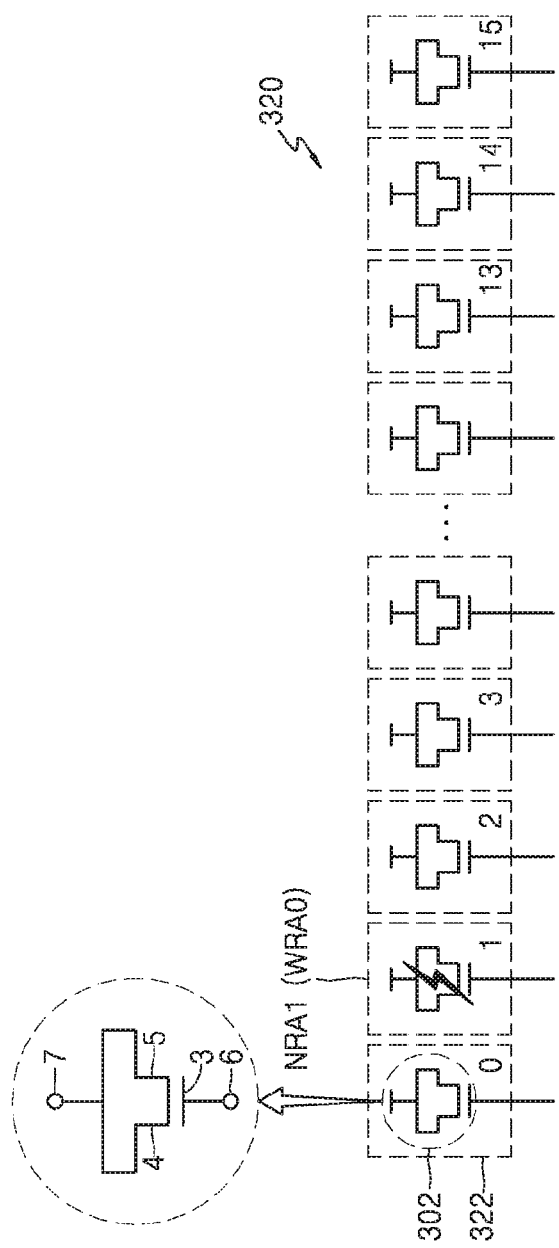
FIG. 3 is a diagram for describing a flag storage of FIG. 2.

In FIG. 3, an anti-fuse 302 included in the storage cells 322 has an electric characteristic opposite to that of a fuse, that is, the anti fuse having a high resistance value when it is not programmed and a low resistance when programmed. The anti-fuse 302 is generally formed by inserting a dielectric between conductors. The anti-fuse 302 is programmed by destroying the dielectric between the conductors by applying a high voltage through the conductors at both ends of the anti-fuse 302. As a result of programming, the conductors at the both ends of the anti-fuse 302 may be short-circuited, and thus the anti-fuse 302 has a low resistance value.

The anti-fuse 302 may be configured as a depletion type metal-oxide-semiconductor (MOS) transistor in which a source 4 and a drain 5 are connected. In an initial state, a resistance between a first node 6 connected to a gate electrode 3 and a second node 7 commonly connected to the source 4 and the drain 5 may be very large because the first and second nodes 6 and 7 are separated by a gate oxide layer. Therefore, the first and second nodes 6 and 7 may be non-conducted. For example, this state may be set as logic "low," that is, a non-programmed state.

The anti-fuse 302 may be irreversibly converted to a conducting state from a non-conducting state by applying a breakdown voltage between the first and second nodes 6 and 7 and thus destroying the gate oxide layer. When the gate oxide layer is destroyed, the resistance between the first and second nodes 6 and 7 may be reduced. This state may be set as logic "high." The logic "high" of the anti-fuse 302 may be set as a weak cell flag. An anti-fuse of a storage cell corresponding to the memory cell row NRA1, i.e., the first weak cell row WRA0, in the memory cell array 110 may be programmed and thus store the weak cell flag.

In FIG. 2, the flag storage 320 may program anti-fuses of storage cells which respectively correspond to the memory cell rows NRA1 and NRA254, i.e., the first and second weak cell rows WRA0 and WRA1, and thus, store weak cell flags. The weak cell flags may be stored in an address flag storage before the memory device 100 is packaged. Also, the weak cell flags may be stored in the flag storage 320 after the memory device 100 is packaged.

According to at least one example embodiment of the inventive concepts, the flag storage 320 may program anti-fuses of storage cells that respectively correspond to memory cell rows that are strong cell rows, and thus store strong cell flags.

Figure 4:
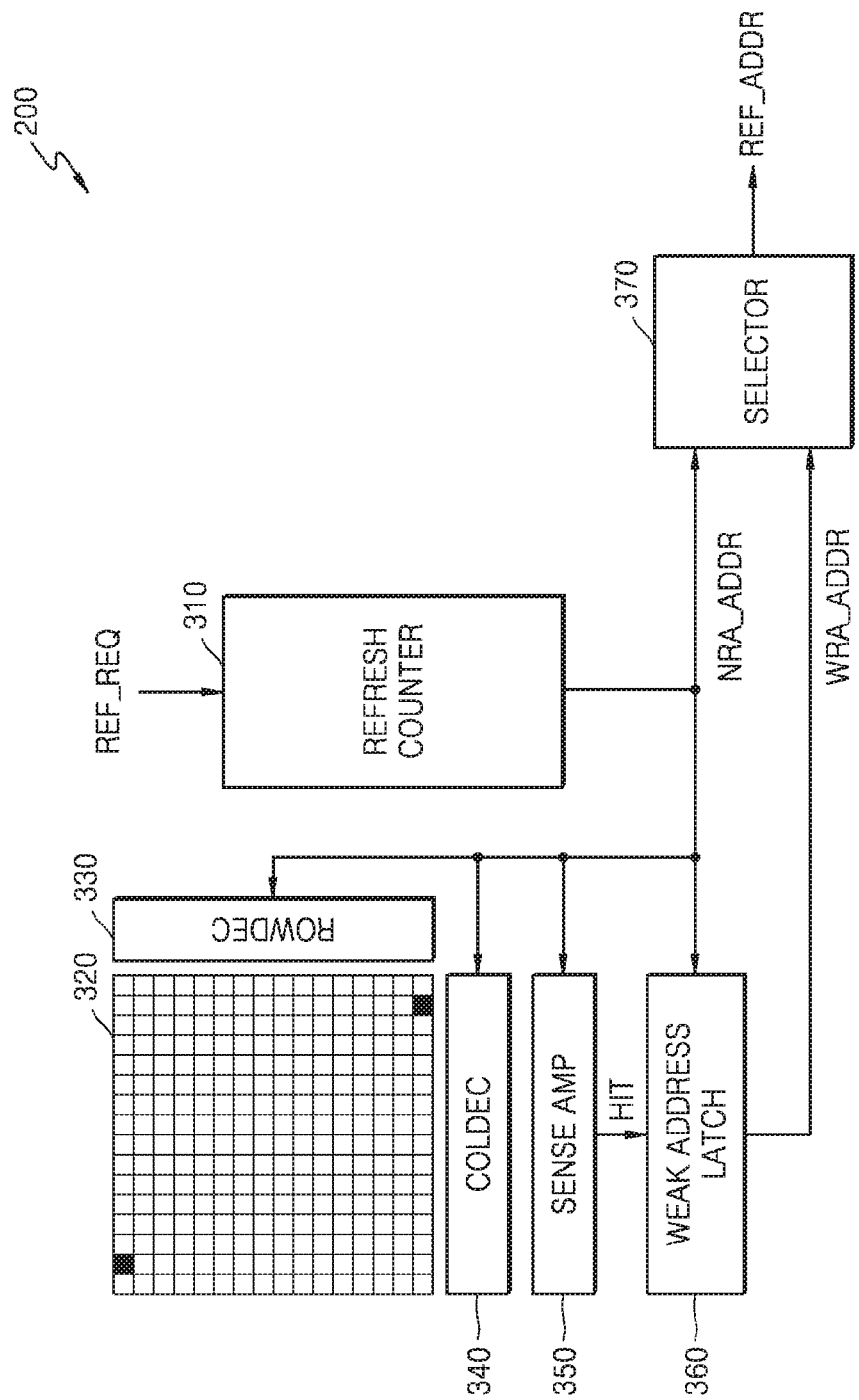
FIG. 4 is a block diagram illustrating the refresh address generator of FIG. 1.

FIG. 4 is a block diagram illustrating the refresh address generator 200 of FIG. 1 according to at least one example embodiment of the inventive concepts.

Referring to FIGS. 1 and 4, the refresh address generator 200 may include the refresh counter 310, the flag storage 320, a row decoder 330, a column decoder 340, a sense amplifier 350, a latch 360, and a selector 370.

As described with reference to FIG. 2, the refresh counter 310 may perform the count operation in response to the refresh request signal REF_REQ, and generate a count output value as a normal cell row address NRA_ADDR. The normal cell row address NRA_ADDR may address the memory cell rows NRA0 to NRA255. The flag storage 320 may include the storage cells 322 that store the weak cell flags with respect to the normal cell row address NRA_ADDR. Among the storage cells 322, those that correspond to normal cell row addresses NRA_ADDR assigned to the address the memory cell rows NRA1 and NRA254, i.e., the first and second weak cell rows WRA0 and WRA1, may store the weak cell flags.

The storage cells 322 of the flag storage 320 may be addresses assigned by the row decoder 330 and the column decoder 340. The row decoder 330 may receive bits of a first group of the normal cell row address NRA_ADDR as row addresses of the storage cells 322, and assign addresses to storage cell rows by decoding the bits of the first group. The column decoder 340 may receive bits of a second group of the normal cell row address NRA_ADDR as column addresses of the storage cells 322, and assign addresses to storage cell columns by decoding the bits of the second group.

The sense amplifier 350 may receive bits of a third group of the normal cell row address NRA_ADDR, and in response to the bits of the third group, select any one of the storage cell columns activated by the column decoder 340. The bits of the first, second, and third groups of the normal cell row address NRA_ADDR may be different from each other. The sense amplifier 350 may sense-amplify a flag stored in a storage cell that corresponds to a storage cell row activated by the row decoder 330 and the selected storage cell column. When the sense-amplified flag of the storage cell is a logic "high" weak cell flag, the sense amplifier 350 may generate a flag hit signal HIT for activating the latch 360.

In response to the flag hit signal HIT, the latch 360 may store a normal cell row address NRA_ADDR corresponding to the flag as a weak cell row address WRA_ADDR.

The selector 370 may receive the normal cell row address NRA_ADDR from the refresh counter 310 and receive the weak cell row address WRA_ADDR from the latch 360. With reference to a count output value of the refresh counter 310, the selector 370 may select any one of the normal cell row address NRA_ADDR and the weak cell row address WRA_ADDR and output the selected one as a refresh row address REF_ADDR.

When the count output value of the refresh counter 310 is output and half of all normal cell row addresses NRA_ADDRs are counted, the selector 370 may select the weak cell row address WRA_ADDR and output the weak cell row address WRA_ADDR as the refresh row address REF_ADDR. According to at least one example embodiment of the inventive concepts, when the count output value of the refresh counter 310 is output and a quarter of the normal cell row addresses NRA_ADDRs are counted, the selector 370 may select the weak cell row address WRA_ADDR and output the weak cell row address WRA_ADDR as the refresh row address REF_ADDR.

The selector 370 may refresh the normal cell row address NRA_ADDR according to a refresh period, and refresh the weak cell row address WRA_ADDR according to a shorter period than the refresh period. For example, the weak cell row address WRA_ADDR may be set to be refreshed after half of the normal cell row addresses NRA_ADDRs are refreshed. According to at least one example embodiment of the inventive concepts, the weak cell row address WRA_ADDR may be refreshed each time quarter of the normal cell row addresses NRA_ADDRs is refreshed.

Figure 5:
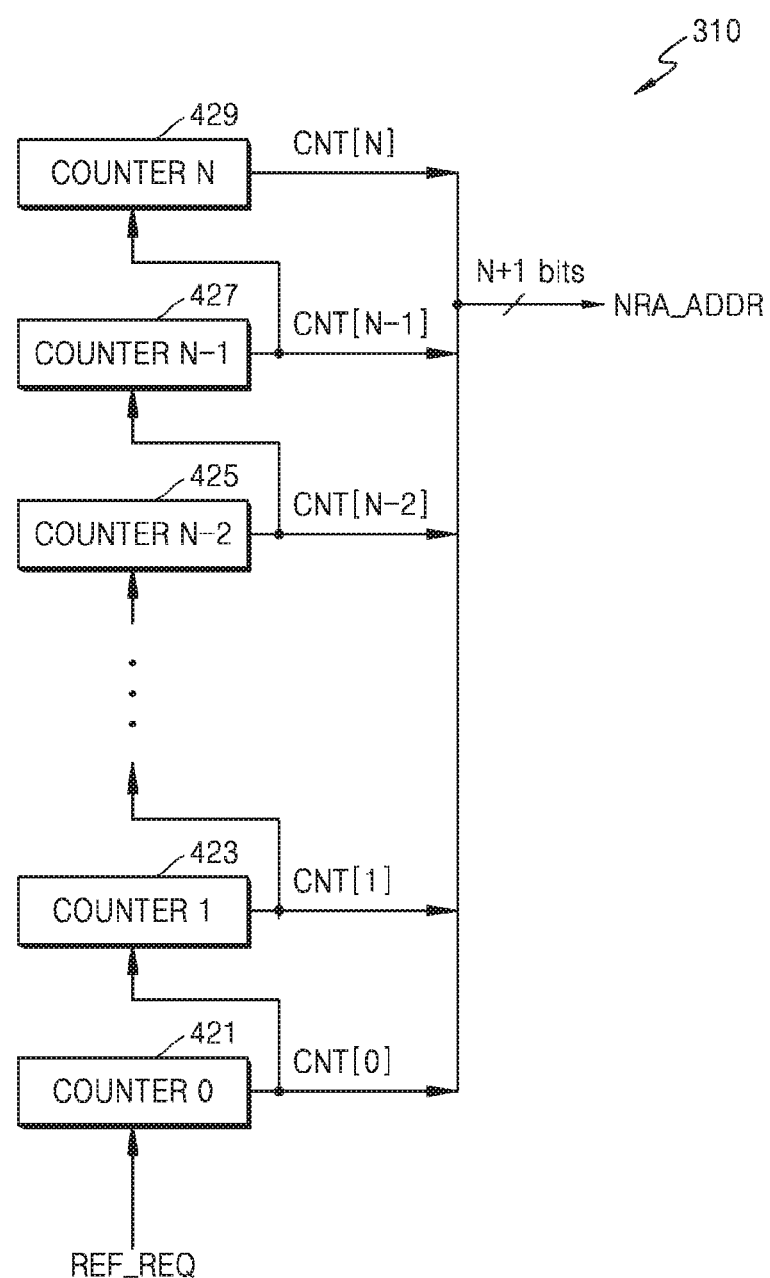
FIG. 5 is a diagram for describing a refresh counter of FIG. 4.

FIG. 5 is a diagram for describing the refresh counter 310 of FIG. 4.

Referring to FIG. 5, the refresh counter 310 may include first to N-th counters (421, 423, 425, 427, and 429) that are connected in series. A first counter 421 may generate a first bit CNT[0] in response to the refresh request signal REF_REQ, a second counter 423 may generate a second bit CNT[1] in response to the first bit CNT[0], an (N−2)-th counter 425 may generate an (N−2)-th bit CNT[N−2] in response to an (N−3)-th bit, an (N−1)-th counter 427 may generate an (N−1)-th bit CNT[N−1] in response to the (N−2)-th bit CNT[N−2], and an N-th counter 429 may generate an N-th bit CNT[N] in response to the (N−1)-th bit CNT[N−1].

The first to N-th bits CNT[0], CNT[1], ..., CNT[N−2], CNT[N−1], and CNT[N] generated by the first to N-th counters (421, 423, 425, 427, and 429) may be output as the normal cell row address NRA_ADDR. The normal cell row address NRA_ADDR may refresh memory cell rows (NRA0 to NRA255 of FIG. 1).

Figure 6:
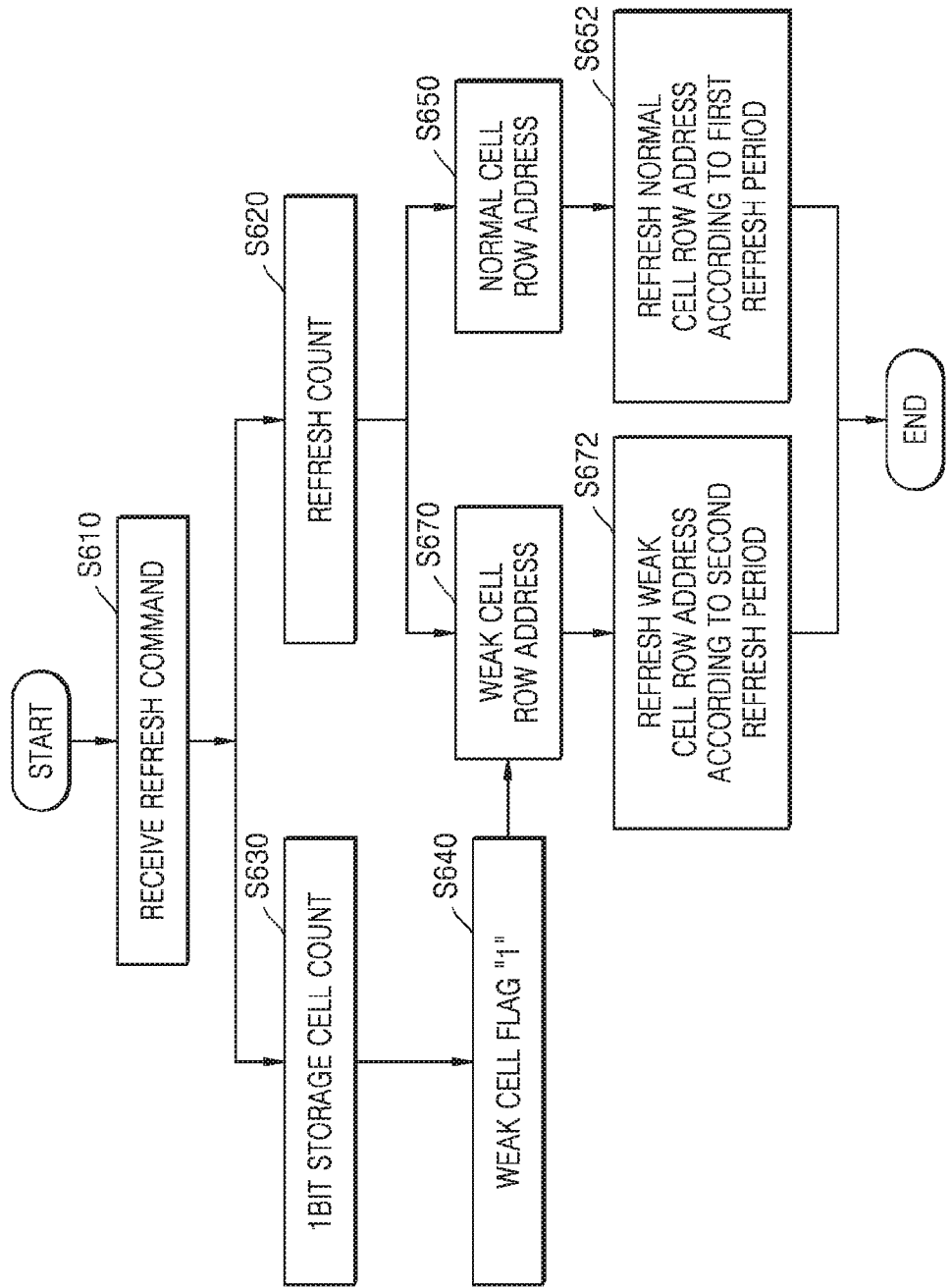
FIG. 6 is a flowchart illustrating a refresh method of a memory device, according to at least one example embodiment of the inventive concepts.

FIG. 6 is a flowchart illustrating a refresh method of the memory device 100, according to at least one example embodiment of the inventive concepts.

Referring to FIGS. 1, 4, and 6, in the memory device 100, weak cell flags that respectively correspond to the memory cell rows NRA0 to NRA255 of the memory cell array 110 and indicate whether a corresponding memory cell row is a weak cell row may be stored in the flag storage 320. 1-bit weak cell flags respectively corresponding to the memory cell rows NRA0 to NRA255 may be stored in the storage cells 322 of the flag storage 320.

The memory device 100 may receive the refresh command REF_CMD (S610). According to at least some example embodiments of the inventive concepts, the command decoder 120 may generate the refresh request signal REF_REQ in response to the refresh command REF_CMD.

The refresh address generator 200 may perform a count operation according to the refresh request signal REF_REQ (S620). According to at least some example embodiments of the inventive concepts, the storage cells 322 of the flag storage 320 may be counted in a manner that is synchronized with the count operation performed by the refresh counter 310 (S630). For example, the storage cells 322 may be counted according to the count output value of the refresh counter 310. The storage cells 322 that are counted may be monitored to determine whether any one of the storage cells 322 stores a weak cell flag (S640).

The count output value of the refresh counter 310 may be output as the normal cell row address NRA_ADDR that corresponds one of the memory cell rows NRA0 to NRA255 (S650). The memory cell rows NRA0 to NRA255 corresponding to the normal cell row address NRA_ADDR may be refreshed according to a first refresh period (S652).

According to the monitoring (S640) result, when one of the storage cells 322 stores a weak cell flag, the latch 360 may store a corresponding count output value of the refresh counter 310 as a weak cell row address WRA_ADDR (S670). The memory cell rows NRA0 to NRA255 corresponding to the weak cell row address WRA_ADDR i.e., the first and second weak cell rows WRA0 and WR1 in the example shown in FIG. 1, may be refreshed according to a second refresh period that is shorter than the first refresh period (S672).

According to the refresh method of the memory device 100, weak cell flags may be stored in the storage cells 322 corresponding to the count output values of the refresh counter 310, and the count output values corresponding to the weak cell flags may be outputted as weak cell row addresses refreshed with a shorter period than the refresh period. Therefore, since the memory device 100 may reduce the refresh period of the weak cell rows without including a weak cell row address storage, the memory device 100 may be less affected by the chip size problem.

Figure 7:
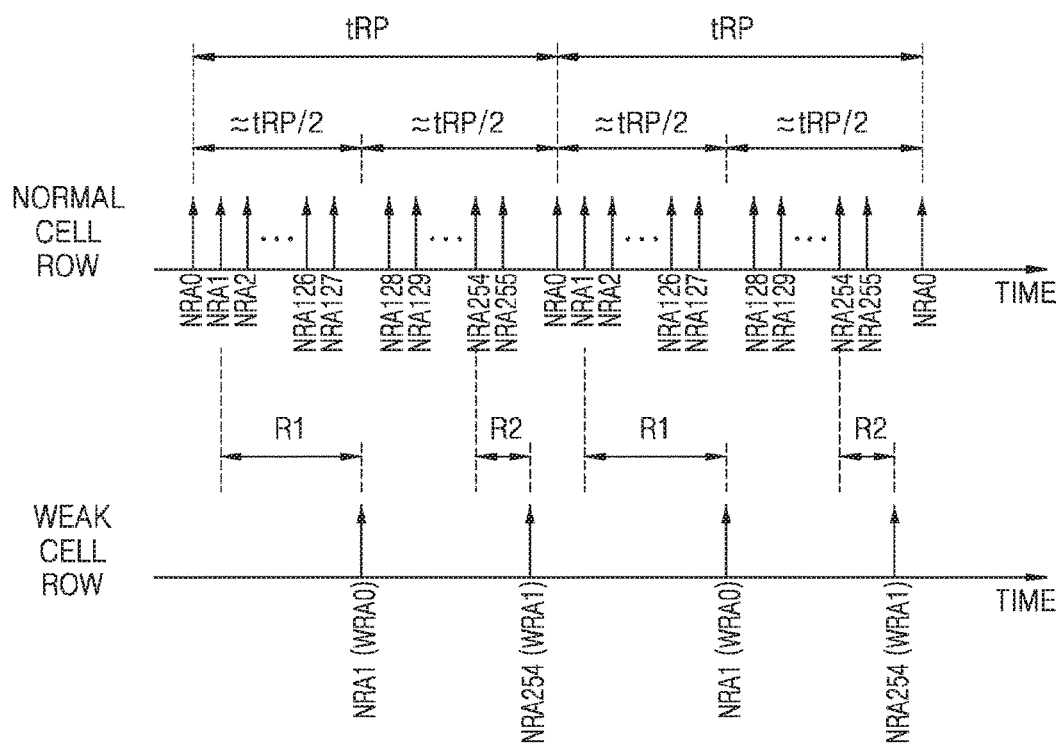
FIG. 7 is a timing diagram for describing an example of a refresh operation of memory cell rows performed according to the refresh method of FIG. 6.

FIG. 7 is a timing diagram for describing an example of a refresh operation of memory cell rows performed according to the refresh method of FIG. 6.

Referring to FIG. 7, normal cell rows NRA0 to NRA255 may be refreshed according to a refresh period tRP, and first and second weak cell rows WRA0 and WRA1 may be refreshed according to a shorter period than the refresh period tRP. For example, the first and second weak cell rows WRA0 and WRA1 may be refreshed twice during the refresh period tRP.

After half of the normal cell rows NRA0 to NRA255, i.e., the normal cell rows NRA0 to NRA127, are sequentially refreshed, the first weak cell row WRA0 may be refreshed. The first weak cell row WRA0 may be the same as the normal cell row NRA1. The normal cell row NRA1 is refreshed for the first time, after an R1 time, the normal cell row NRA1 may be refreshed for the second time as the first weak cell row WRA0. The R1 time may be shorter than ½ of the refresh period tRP. The first weak cell row WRA0 may be refreshed twice during the refresh period tRP.

Next, after the remaining half, i.e., the normal cell rows NRA128 to NRA255, are sequentially refreshed, the second weak cell row WRA1 may be refreshed. The second weak cell row WRA1 may be the same as the normal cell row NRA254. The normal cell row NRA254 is refreshed for the first time, after an R2 time, the normal cell row NRA254 may be refreshed for the second time as the second weak cell row WRA1. The R2 time may be shorter than ½ of the refresh period tRP. The second weak cell row WRA1 may be refreshed according to about ½ of the refresh period tRP.

Figure 8:
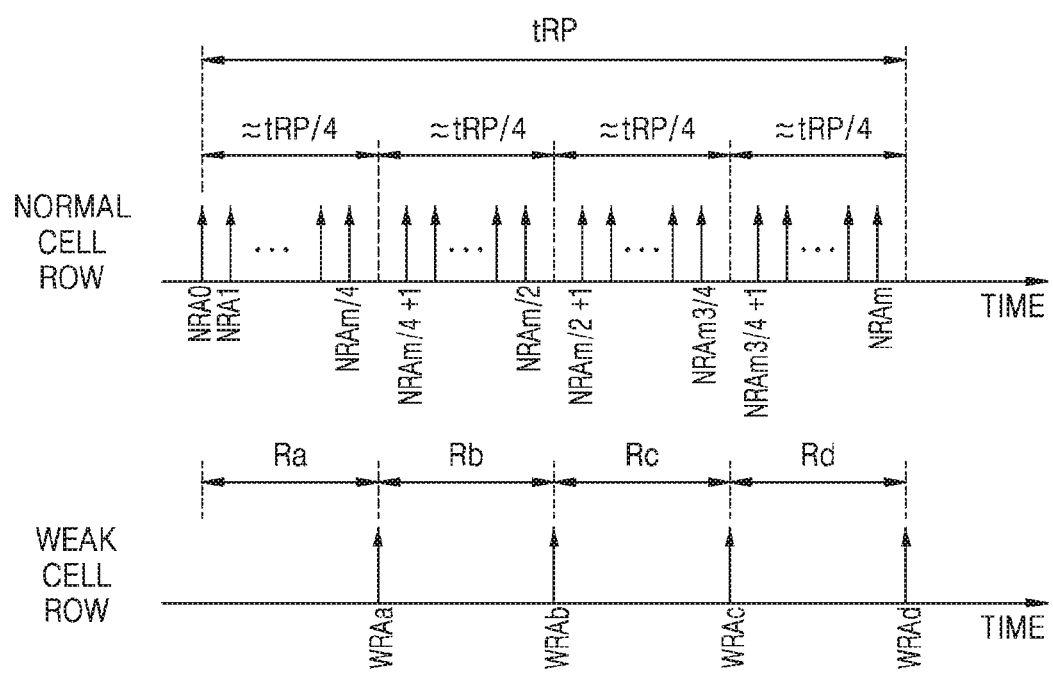
FIG. 8 is a timing diagram for describing another example of a refresh operation of memory cell rows that is performed according to the refresh method of FIG. 6.

FIG. 8 is a timing diagram for describing another example of a refresh operation of memory cell rows that is performed according to the refresh method of FIG. 6.

Referring to FIG. 8, normal cell rows NRA0 to NRAm may be refreshed according to a refresh period tRP, and first to fourth weak cell rows WRAa, WRAb, WRAc, and WRAd may be refreshed according to a shorter period than the refresh period tRP. For example, the first to fourth weak cell rows WRAa, WRAb, WRAc, and WRAd may be refreshed according to about ¼ of the refresh period tRP.

The first weak cell row WRAa may be any one of the normal cell rows NRA0 to NRAm/4 that are refreshed according to a period Ra that is equal to ¼ of the refresh period tRP. During the period Ra, after a normal cell row corresponding to the first weak cell row WRAa is refreshed, the first weak cell row WRAa may be refreshed. Therefore, the weak cell row WRAa may be refreshed twice during the refresh period tRP.

The second weak cell row WRAb may be any one of the normal cell rows NRAm/4+1 to NRAm/2 that are refreshed according to a period Rb that is equal to ¼ of the refresh period tRP. During the period Rb, after a normal cell row corresponding to the second weak cell row WRAb is refreshed, the second weak cell row WRAb may be refreshed. Therefore, the second weak cell row WRAb may be refreshed twice during the refresh period tRP.

Likewise, the third weak cell row WRAc may be any one of the normal cell rows NRAm/2+1 to NRAm3/4. During a period Rc, after a normal cell row corresponding to the third weak cell row WRAc is refreshed, the third weak cell row WRAc may be refreshed. Therefore, the third weak cell row WRAc may be refreshed twice during the refresh period tRP. The fourth weak cell row WRAd may be any one of the normal cell rows NRAm3/4+1 to NRAm. During the period Rd, after a normal cell row corresponding to the fourth weak cell row WRAd is refreshed, the fourth weak cell row WRAd may be refreshed. Therefore, the fourth weak cell row WRAd may be refreshed twice during the refresh period tRP.

Figure 9:
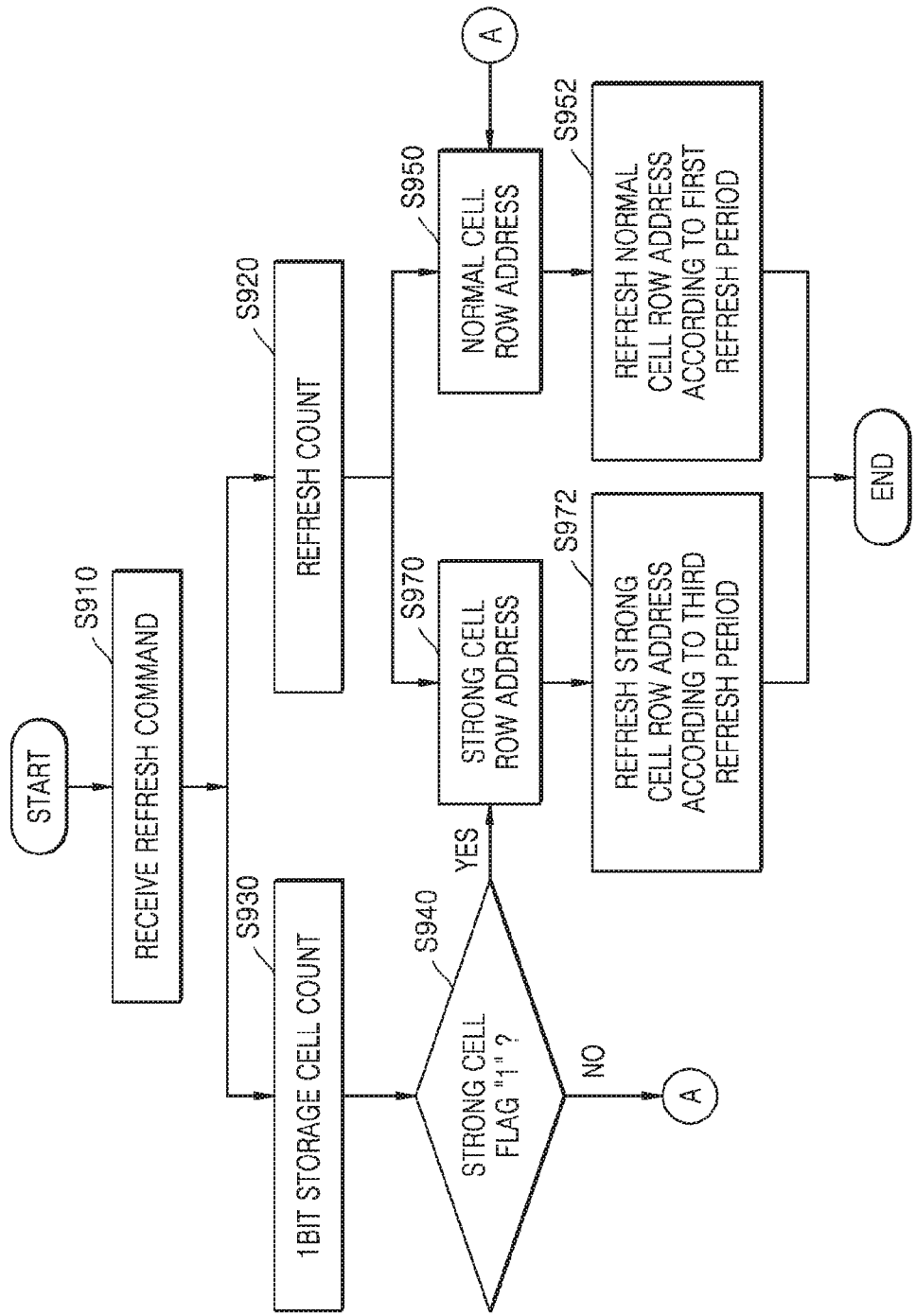
FIG. 9 is a flowchart illustrating a refresh method of a memory device, according to at least another example embodiment of the inventive concepts.

FIG. 9 is a flowchart illustrating a refresh method of a memory device, according to at least another example embodiment of the inventive concepts.

Referring to FIG. 9, in the memory device, strong cell flags that respectively correspond to memory cell rows of a memory cell array and indicate whether a corresponding memory cell row is a strong cell row may be in a flag storage. Storage cells of the flag storage may store 1-bit strong cell flags that respectively correspond to the memory cell rows.

The memory device may receive a refresh command (S910), and generate a refresh request signal in response to the refresh command. According to at least one example embodiment of the inventive concepts, a refresh address generator may perform a count operation according to the refresh request signal (S920). The storage cells of the flag storage may be counted according to the count operation performed by the refresh counter (S930). The counted storage cells may be monitored to determine whether any one of the storage cells stores a strong cell flag (S940).

According to the monitoring (S940) result, when a storage cell does not store a strong cell flag, a corresponding count output value of the refresh counter 310 may be output as a normal cell row address corresponding to a memory cell row (S950). The normal cell row address may be refreshed according to a first refresh period (S952).

According to the monitoring (S940) result, when a storage cell stores a strong cell flag, a corresponding count output value of the refresh counter 310 may be stored as a strong cell row address (S970). The strong cell row address may be refreshed according to a third period that is longer than the refresh period (S972).

As described above, with respect to the refresh method of the memory device according to at least one example embodiment of the inventive concepts, the strong cell flag may be stored in the storage cell that corresponds to the count output value of the refresh counter, and the count output value corresponding to the strong cell flag may be refreshed according to a period (i.e., the third refresh period) longer than the first refresh period. Accordingly, since the memory device may refresh the strong cell rows for a long period without including a strong cell row address storage, the memory device may be less affected by the chip size problem and consume less power.

Figure 10:
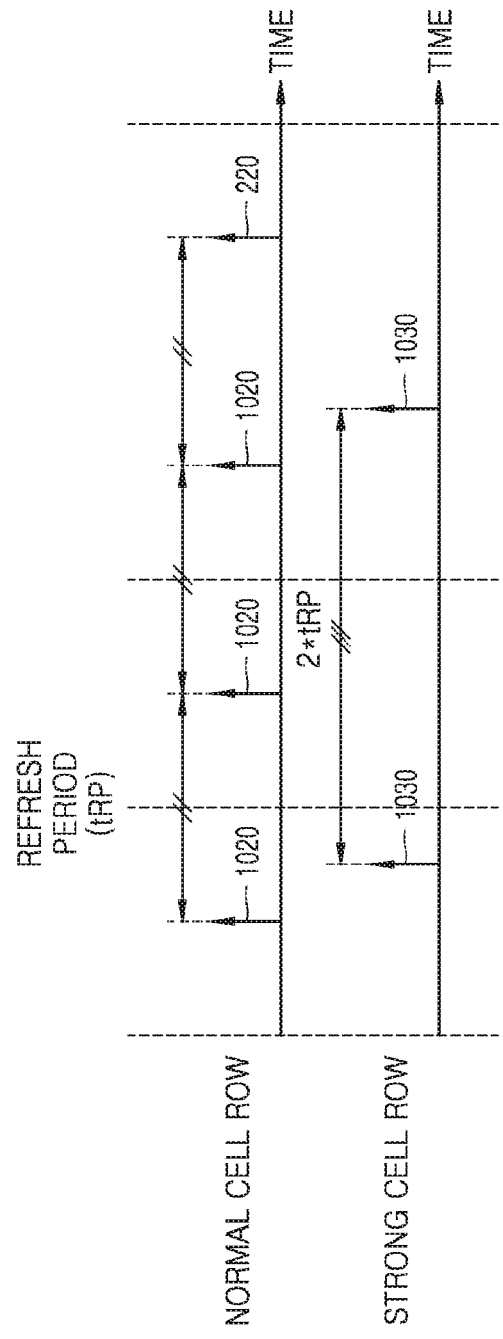
FIG. 10 is a timing diagram for describing a refresh operation of memory cell rows that is performed according to the refresh method of FIG. 9.

FIG. 10 is a timing diagram for describing a refresh operation of memory cell rows that is performed according to the refresh method of FIG. 9.

Referring to FIG. 10, memory cell rows having a minimum data retention time that is longer than a refresh period tRP may be set as strong cell rows. Since the strong cell rows may store data even when the strong cell rows are refreshed according to a longer period than the refresh period tRP, a refresh operation 1030 of the strong cell rows may be performed according to, for example, a period equal to about twice as long as the refresh period tRP.

Among all memory cell rows, memory cell rows other than the strong cell rows may be set as normal cell rows and refreshed according to the refresh period tRP. When a refresh row address of each memory cell row is generated by the refresh counter, a refresh operation 1020 of the memory cell rows other than the strong cell rows may be performed according to the refresh period tRP.

Figure 11:
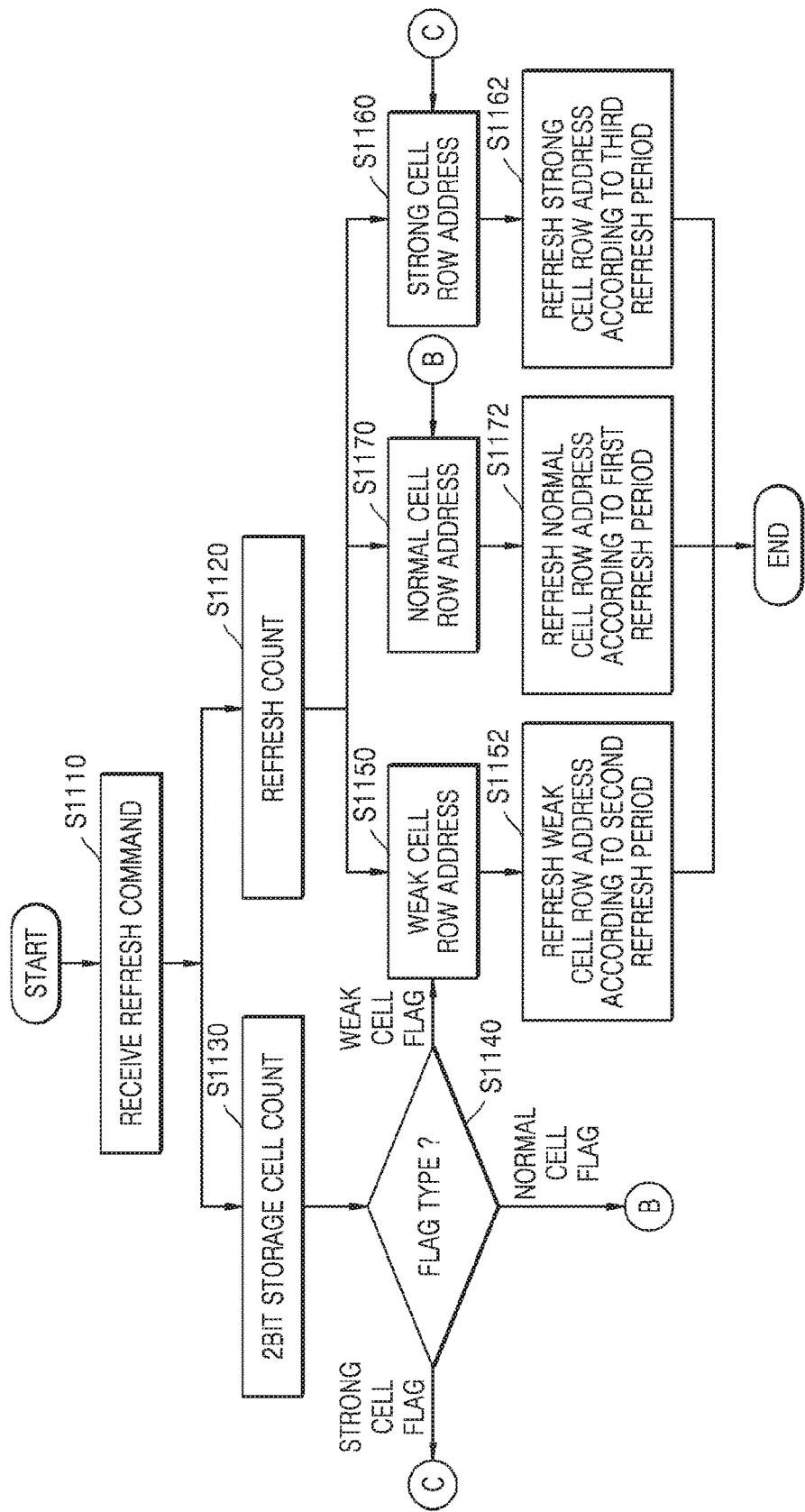
FIG. 11 is a flowchart illustrating a refresh method of a memory device, according to at least another example embodiment of the inventive concepts.

FIG. 11 is a flowchart illustrating a refresh method of a memory device, according to at least another example embodiment of the inventive concepts.

Referring to FIG. 11, in a flag storage, the memory device may store a flag for each memory cell row of a memory cell array which indicates whether a memory cell row is a weak cell row or a strong cell row. According to at least one example embodiment of the inventive concepts, a storage cell of the flag storage may store 2-bit flags that respectively correspond to the memory cell rows.

The memory device may receive a refresh command (S1110), and generate a refresh request signal in response to the refresh command. A refresh address generator may perform a count operation according to the refresh request signal (S1120). Storage cells of the flag storage may be counted according to the count operation of a refresh counter (S1130). Flags stored in the counted storage cells may be monitored (S1140).

According to the monitoring (S1140) result, when a storage cell stores a weak cell flag, a corresponding count output value of the refresh counter may be stored as a weak cell row address (S1150). The weak cell row address may be refreshed according to a second period that is shorter than the refresh period tRP (S1152).

According to the monitoring (S1140) result, when a storage cell stores a strong cell flag, a corresponding count output value of the refresh counter may be stored as a strong cell row address (S1160). The strong cell row address may be refreshed according to a third period that is longer than the refresh period tRP (S1162).

According to the monitoring (S1140) result, when a storage cell stores a normal cell flag (i.e., not a weak cell flag nor a strong cell flag), a corresponding count output value of the refresh counter may be output as a normal cell row address (S1170). The normal cell row address may be refreshed according to a first period that is equal to the refresh period tRP (S1172).

In accordance with the refresh method of the memory device according to at least one example embodiment of the inventive concepts, a weak cell flag or a strong cell flag may be stored in a storage cell corresponding to a count output value of the refresh counter. A count output value corresponding to the weak cell flag may be stored as a weak cell row address and refreshed according to a shorter period than a refresh period, and a count output value corresponding to the strong cell flag may be stored as a strong cell row address and refreshed according to a longer period than the refresh period. Accordingly, the memory device may refresh weak cell rows for a short time and refresh strong cell rows for a long time without including a weak cell row address storage and a strong cell row address storage. Thus, the memory device may not have a chip size problem and consume less power.

Figure 12:
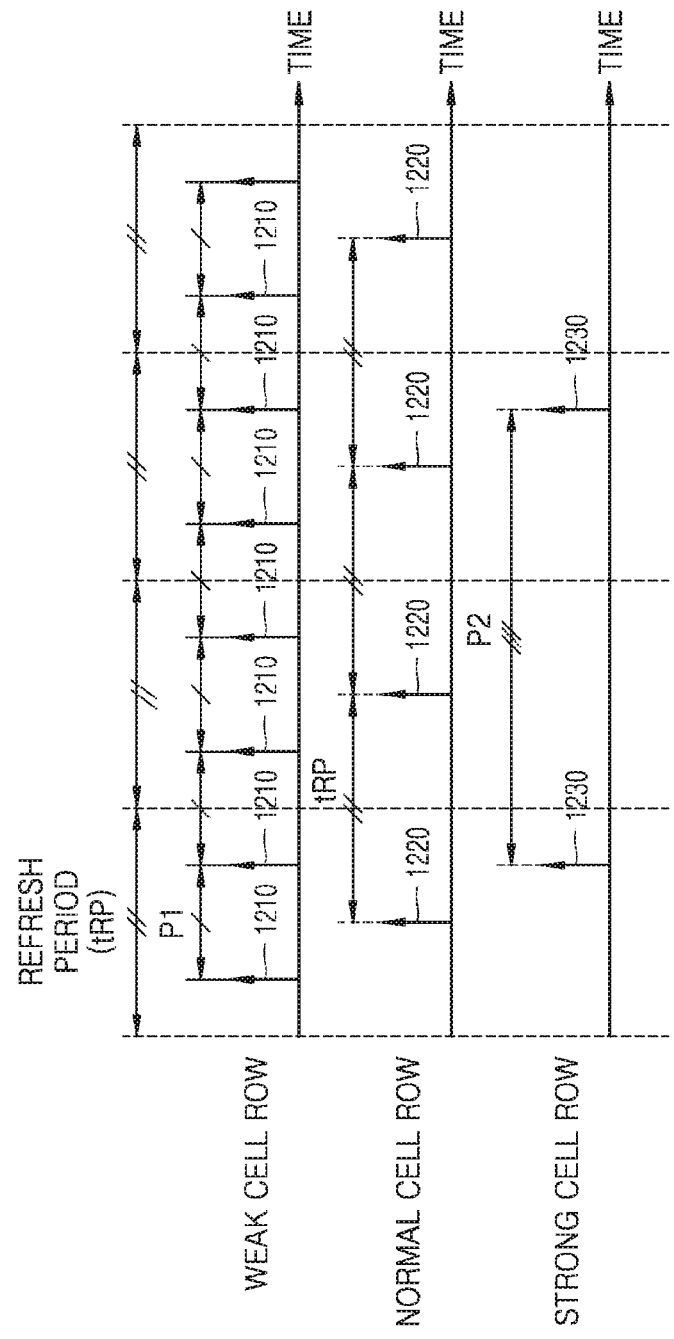
FIG. 12 is a timing diagram illustrating a refresh operation of memory cell rows that is performed according to the refresh method of FIG. 11.

FIG. 12 is a timing diagram illustrating a refresh operation of the memory cell rows performed according to the refresh method of FIG. 11.

Referring to FIG. 12, memory cell rows having a data retention time that is shorter than a refresh period tRP may be set as weak cell rows. The weak cell rows may be refreshed according to a shorter period than the refresh period tRP. A refresh operation 1210 of the weak cell rows may be performed according to, for example, a period P1 that is equal to about ½ of the refresh period tRP.

Memory cell rows having a minimum data retention time that is longer than a refresh period tRP may be set as strong cell rows. Since the strong cell rows may store data even when the strong cell rows are refreshed according to a longer period than the refresh period tRP, a refresh operation 1230 of the strong cell rows may be performed according to, for example, a period P2 that is equal to about twice as long as the refresh period tRP.

Among all the memory cell rows, memory cell rows other than the weak cell rows and the strong cell rows may be set as normal cell rows and refreshed according to the refresh period tRP. When a refresh row address of each memory cell row is generated by the refresh counter, a refresh operation 1220 of the memory cell rows other than the weak cell rows and the strong cell rows (i.e., the normal memory cell rows) may be performed according to the refresh period tRP.

Figure 13:
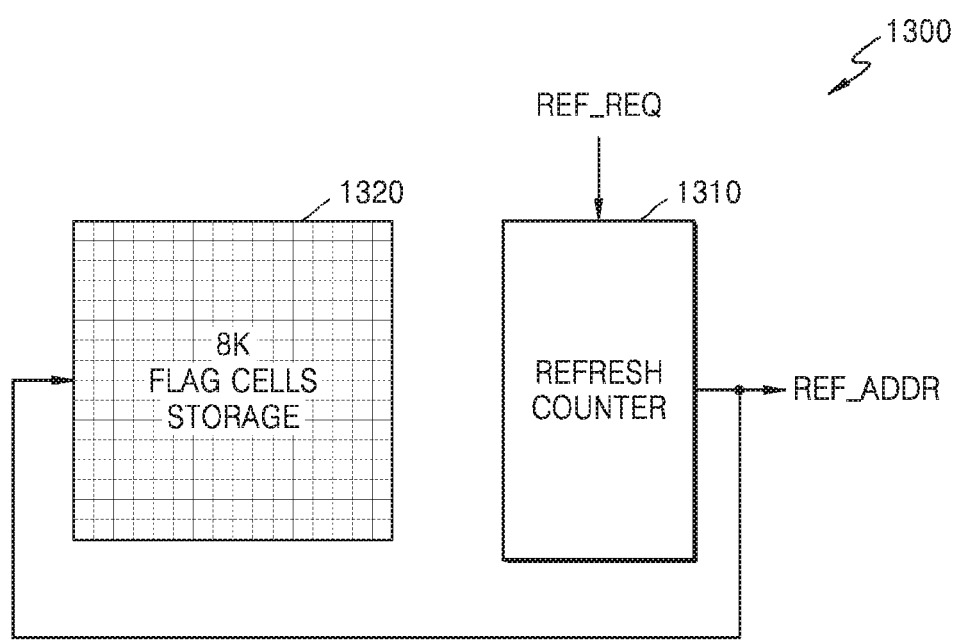
FIGS. 13 and 14 are diagrams for describing operations of refresh address generators according to at least some example embodiments of the inventive concepts.
Figure 14:
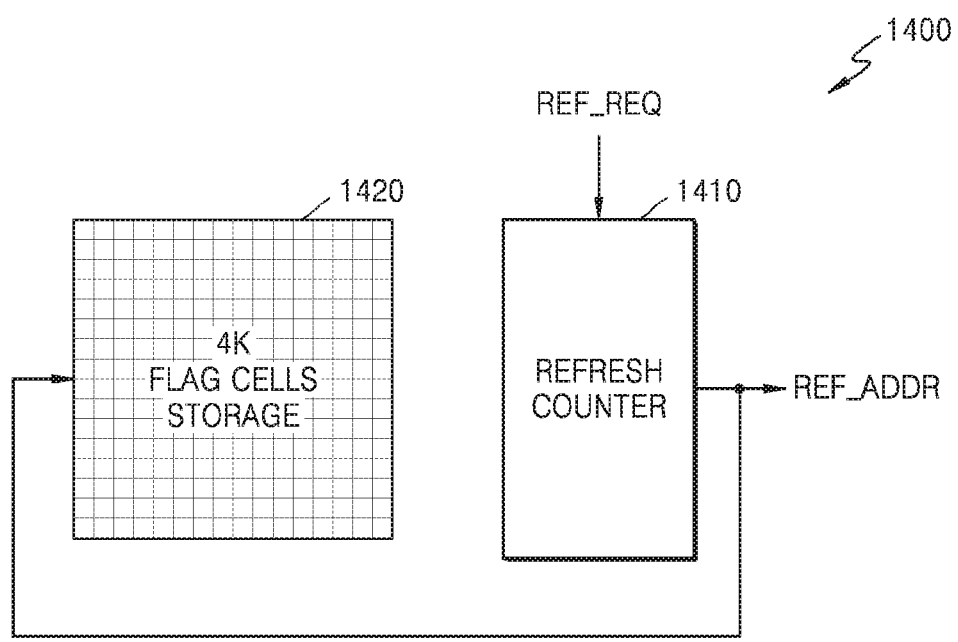

FIGS. 13 and 14 are diagrams for describing operations of refresh address generators 1300 and 1400 according to at least some example embodiments of the inventive concepts. FIG. 13 illustrates the refresh address generator 1300 for performing a refresh operation on 8K memory cell rows for 64 ms according to the DRAM standard. FIG. 14 illustrates the refresh address generator 1400 for performing a refresh operation on 4K memory cell rows for 32 ms according to the DRAM standard Referring to FIG. 13, the refresh address generator 1300 may include a refresh counter 1310 that generates a refresh row address REF_ADDR corresponding to each 8K memory cell row and a flag storage 1320 that stores a flag corresponding to the refresh row address REF_ADDR. The flag storage 1320 may store a weak cell flag in a storage cell corresponding to a refresh row address REF_ADDR of a memory cell row determined as a weak cell row, or a strong cell flag in a storage cell corresponding to a refresh row address REF_ADDR of a memory cell row determined as a strong cell row. According to at least some example embodiments of the inventive concepts, the flag storage 1320 may also store a normal cell flag in a storage cell corresponding to a refresh row address REF_ADDR of a memory cell row determined as a normal cell row (i.e., neither a weak cell row or a strong cell row).

When a storage cell of the flag storage 1320 stores a weak cell flag, a corresponding refresh row address REF_ADDR may be a weak cell row address and may be refreshed according to a shorter period than a refresh period tRP. When a storage cell of the flag storage 1320 stores a strong cell flag, a corresponding refresh row address REF_ADDR may be a strong cell row address and may be refreshed according to a longer period than the refresh period tRP. When a storage cell of the flag storage 1320 is neither a weak cell flag nor a strong cell flag, but is a normal cell flag, a corresponding refresh row address REF_ADDR may be a normal cell row address and may be refreshed according to the refresh period tRP.

Referring to FIG. 14, the refresh address generator 1400 may include a refresh counter 1410 that generates a refresh row address REF_ADDR corresponding to each 4K memory cell row and a flag storage 1420 that stores a flag corresponding to the refresh row address REF_ADDR. The flag storage 1420 may include storage cells that store a weak cell flag or a strong cell flag. According to at least some example embodiments of the inventive concepts, the flag storage 1420 may also store a normal cell flag in a storage cell corresponding to a refresh row address REF_ADDR of a memory cell row determined as a normal cell row (i.e., neither a weak cell row or a strong cell row).

When a storage cell of the flag storage 1420 stores a weak cell flag, a corresponding refresh row address REF_ADDR may be a weak cell row address and may be refreshed according to a shorter period than the refresh period tRP. When a storage cell of the flag storage 1420 stores a strong cell flag, a corresponding refresh row address REF_ADDR may be a strong cell row address and may be refreshed according to a longer period than the refresh period tRP. When a storage cell of the flag storage 1420 is neither a weak cell flag nor a strong cell flag, but is a normal cell flag, a corresponding refresh row address REF_ADDR may be a normal cell row address and may be refreshed according to the refresh period tRP.

Figure 15:
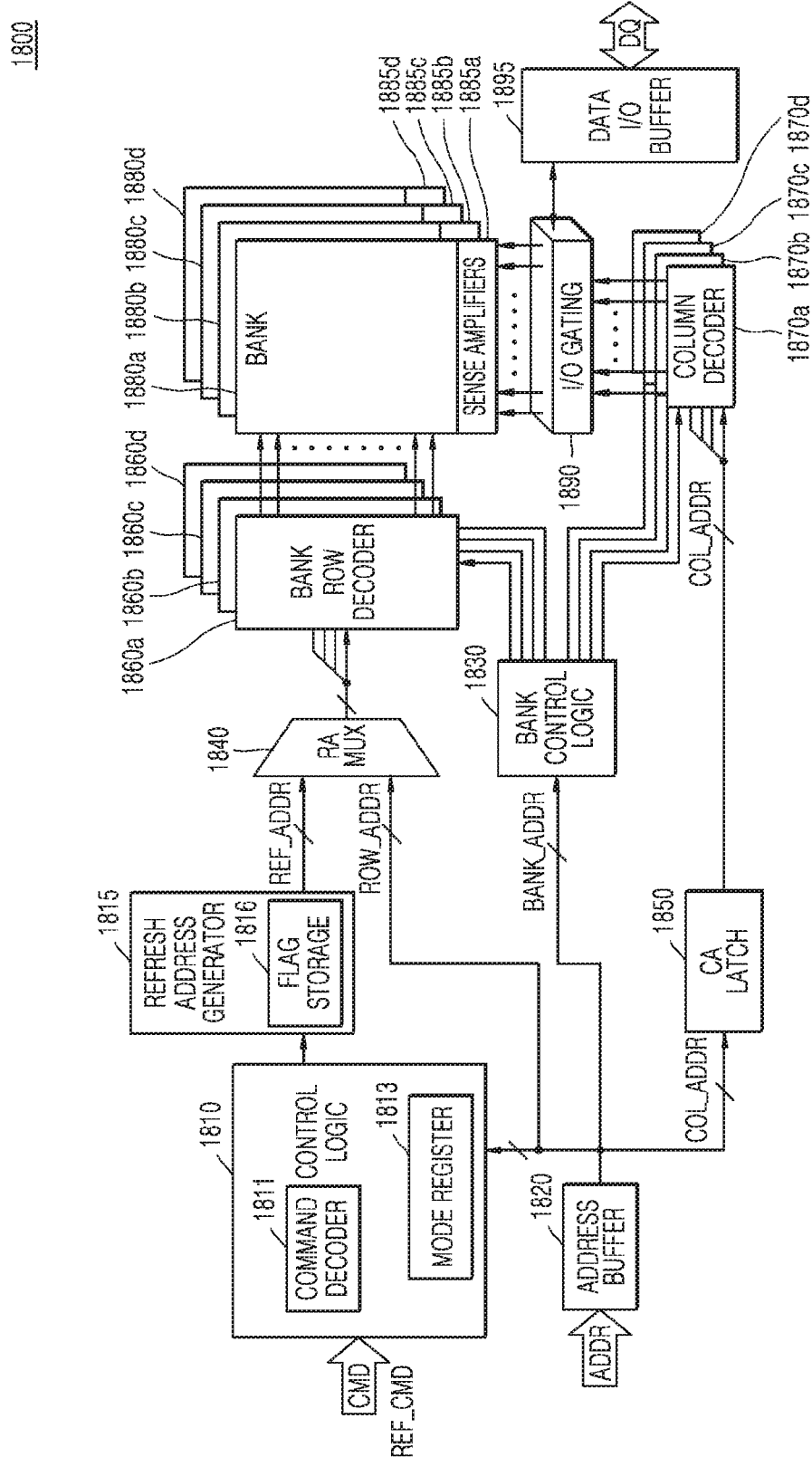
FIG. 15 is a block diagram illustrating a memory device performing a refresh operation by using a cell characteristic flag, according to at least another example embodiment of the inventive concepts.

FIG. 15 is a block diagram illustrating a memory device 1800 performing a refresh operation by using a cell characteristic flag, according to at least another example embodiment of the inventive concepts.

Referring to FIG. 15, the memory device 1800 may include a control logic 1810, a refresh address generator 1815, an address buffer 1820, a bank control logic 1830, a row address multiplexer 1840, a column address latch 1850, first to fourth bank row decoders 1860a, 1860b, 1860c, and 1860d, a memory cell array, sense amplifiers 1885a, 1885b, 1885c, and 1885d, an I/O gating circuit 1890, and a data I/O buffer 1895.

The memory cell array may include first to fourth bank arrays 1880a, 1880b, 1880c, and 1880d. Each of the first to fourth bank arrays 1880a, 1880b, 1880c, and 1880d may include a plurality of memory cell rows (or pages), and the first to fourth bank arrays 1880a, 1880b, 1880c, and 1880d may respectively include the sense amplifiers 1885a, 1885b, 1885c, and 1885d that sense-amplify memory cells connected to each memory cell row.

The first to fourth bank row decoders 1860a, 1860b, 1860c, and 1860d may be respectively connected to the first to fourth bank arrays 1880a, 1880b, 1880c, and 1880d. First to fourth bank column decoders 1870a, 1870b, 1870c, and 1870d may be respectively connected to the first to fourth bank arrays 1880a, 1880b, 1880c, and 1880d.

The first to fourth bank arrays 1880a, 1880b, 1880c, and 1880d, the first to fourth bank row decoders 1860a, 1860b, 1860c, and 1860d, and the first to fourth bank column decoders 1870a, 1870b, 1870c, and 1870d may considered as first to fourth memory banks, respectively. Although the memory device 1800 of FIG. 15 includes four memory banks, the memory device 1800 may include any number of memory banks according to at least some example embodiments of the inventive concepts.

Also, according to at least one example embodiment of the inventive concepts, the memory device 1800 may be DRAM, such as double data rate synchronous DRAM (DDR SDRAM), low power double data rate (LPDDR) SDRAM, graphics double data rate (GDDR) SDRAM, or Rambus DRAM (RDRAM).

The control logic 1810 may control operations of the memory device 1800. For example, the control logic 1810 may generate control signals so that the memory device 1800 performs a write operation or a read operation. The control logic 1810 may include a command decoder 1811 that decodes a command CMD that is received from a memory controller and a mode register 1813 that sets an operation mode of the memory device 1800. The mode register 1813 may provide a plurality of operation options of the memory device 1800 and program various functions, characteristics, and modes of the memory device 1800. According to at least one example embodiment, the control logic 1810 may be implemented by hardware, software, or a combination of software and hardware. For example, according to at least one example embodiment, the control logic 1810 may be implemented by circuitry or a circuit structured to perform any or all of the operations described herein as being performed by the control logic 1810. Further, according to at least one example embodiment, the control logic 1810 may be implemented by a processor (e.g., a processor included in memory device 1800) executing instructions corresponding to any or all of the operations described herein as being performed by the control logic 1810.

The command decoder 1811 may decode a write enable signal (/WE), a row address strobe signal (/RAS), a column address strobe signal (/CAS), a chip selecting signal (/CS), and thus, generate a command signal that corresponds to the command CMD. The command CMD may include an active command, a read command, a write command, and a precharge command.

The control logic 1810 may additionally receive differential clocks CLK_t and CLK_c and a clock enable signal CKE for driving the memory device 1800 by using a synchronization method. Data of the memory device 1800 may be operated upon at a double data rate. The clock enable signal CKE may be captured at a rising edge of the clock signal CLK_t.

The control logic 1810 may control the refresh address generator 1815 in response to a refresh command REF_CMD so that an auto refresh operation is performed, or control the refresh address generator 1815 in response to a self-refresh entry command so that the refresh address generator 1815 performs a self-refresh operation.

The refresh address generator 1815 may generate a refresh row address REF_ADDR that corresponds to a memory cell row on which a refresh operation is to be performed. The refresh address generator 1815 may generate the refresh row address REF_ADDR according to a refresh period defined in a volatile memory device standard. According to at least one example embodiment, the refresh address generator 1815 may be implemented by hardware, software, or a combination of software and hardware. For example, according to at least one example embodiment, the refresh address generator 1815 may be implemented by circuitry or a circuit structured to perform any or all of the operations described herein as being performed by the refresh address generator 1815. Further, according to at least one example embodiment, the refresh address generator 1815 may be implemented by a processor (e.g., a processor included in memory device 1800) executing instructions corresponding to any or all of the operations described herein as being performed by the refresh address generator 1815.

The refresh address generator 1815 may include a flag storage 1816 that stores, with respect to refresh row addresses, a weak cell flag that indicates a weak cell row including at least one memory cell having a data retention time that is shorter than a refresh period and a strong cell flag that indicates a strong cell row including at least one memory cell having a data retention time that is longer than the refresh period, with regard to the memory cell rows in the first to fourth bank arrays 1880a, 1880b, 1880c, and 1880d.

The refresh address generator 1815 may refresh the weak cell row according to a shorter period than the refresh period, refresh the strong cell row according to a longer period than the refresh period, and refresh normal cell rows, which are memory cell rows other than the weak cell row and the strong cell row, according to the refresh period.

The address buffer 1820 may receive an address ADDR that includes a bank address BANK_ADDR, a row address ROW_ADDR, and a column address COL_ADDR from the memory controller. Also, the address buffer 1820 may provide the received bank address BANK_ADDR to the bank control logic unit 1830, the received row address ROW_ADDR to the row address multiplexer 1840, and the column address COL_ADDR to the column address latch 1850.

The bank control logic 1830 may generate bank control signals in response to the bank address BANK_ADDR. In response to the bank control signals, a bank row decoder that corresponds to the bank address BANK_ADDR may be activated from among the first to fourth bank row decoders 1860a, 1860b, 1860c, and 1860d, and a bank column decoder that corresponds to the bank address BANK_ADDR may be activated from among the first to fourth bank column decoders 1870a, 1870b, 1870c, and 1870d.

The bank control logic 1830 may generate bank group control signals in response to the bank address BANK_ADDR that determines bank groups. In response to the bank group control signals, row decoders of a bank group corresponding to the bank address BANK_ADDR may be activated from among the first to fourth bank row decoders 1860a, 1860b, 1860c, and 1860d, and column decoders of a bank group corresponding to the bank address BANK_ADDR may be activated from among the first to fourth bank column decoders 1870a, 1870b, 1870c, and 1870d.

The row address multiplexer 1840 may receive the row address ROW_ADDR from the address buffer 1820, and a refresh row address REF_ADDR from the refresh address generator 1815. The row address multiplexer 1840 may selectively output the row address ROW_ADDR or the refresh row address REF_ADDR. A row address that is output from the row address multiplexer 1840 may be applied to each of the first to fourth bank row decoders 1860a, 1860b, 1860c, and 1860d.

From among the first to fourth bank row decoders 1860a, 1860b, 1860c, and 1860d, the bank row decoder that is activated by the bank control logic 1830 may decode the row address that is output from the row address multiplexer 1840, and thus, activate a word line that corresponds to the row address. For example, the activated bank row decoder may apply a word line driving voltage to the word line that corresponds to the row address.

The column address latch 1850 may receive the column address COL_ADDR from the address buffer 1820 and temporarily store the received column address COL_ADDR. The column address latch 1850 may gradually increase the received column address COL_ADDR in a burst mode. The column address latch 1850 may apply the temporarily stored or gradually increased column address COL_ADDR to each of the first to fourth bank column decoders 1870*a*, 1870*b*, 1870*c*, and 1870*d*.

From among the first to fourth bank column decoders 1870*a*, 1870*b*, 1870*c*, and 1870*d*, the bank column decoder that is activated by the bank control logic unit 1830 may activate sense amplifiers that respectively correspond to the bank address BANK_ADDR and the column address COL_ADDR via the I/O gating circuit 1890.

The I/O gating circuit 1890 may include not only circuits for gating I/O data, but also an input data mask logic unit, read data latches for storing data output from the first to fourth bank arrays 1880*a*, 1880*b*, 1880*c*, and 1880*d*, and a write driver for writing data to the first to fourth bank arrays 1880*a*, 1880*b*, 1880*c*, and 1880*d*.

Write data, which is to be written to a memory cell array of a bank array selected from the first to fourth bank arrays 1880*a*, 1880*b*, 1880*c*, and 1880*d*, may be provided to the data I/O buffer 1895 from the memory controller via the memory buffer. The write data provided to the data I/O buffer 1895 may be written to the bank array via the write driver.

Figure 16:
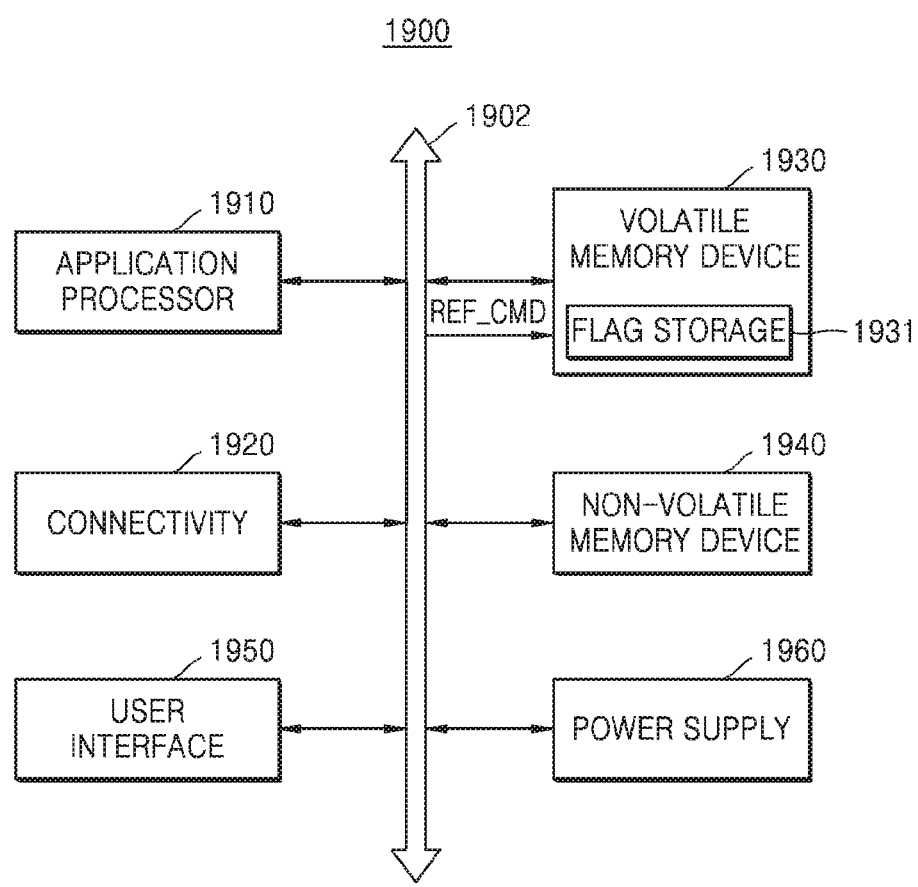
FIG. 16 is a block diagram illustrating a mobile system to which memory devices performing a refresh operation by using cell characteristic flags, according to at least some example embodiments of the inventive concepts, are applied.

FIG. 16 is a block diagram illustrating a mobile system 1900 to which memory devices performing a refresh operation by using cell characteristic flags, according to at least some example embodiments of the inventive concepts, are applied.

Referring to FIG. 16, the mobile system 1900 may include an application processor 1910, a connectivity unit 1920, a first memory device 1930, a second memory device 1940, a user interface 1950, and a power supply 1960 that are connected to each other via a bus 1902. The first memory device 1930 may be a volatile memory device and the second memory device 1940 may be a non-volatile memory device. According to an embodiment, the mobile system 1900 may be any mobile system, including, for example, a mobile phone, a smart phone, a personal digital assistant (PDA), a portable multimedia player (PMP), a digital camera, a music player, a portable game console, or a navigation system.

The application processor 1910 may execute applications that provide Internet browsers, games, videos, etc. According to an embodiment, the application processor 1910 may include a single core or multiple cores. For example, the application processor 1910 may include dual-core processors, quad-core processors, or hexa-core processors. Also, according to at least one example embodiment of the inventive concepts, the application processor 1910 may include an internal or external cache memory.

The connectivity unit 1920 may perform wired or wireless communication with an external device. For example, the connectivity unit 1920 may perform Ethernet communication, Near Field Communication (NFC), Radio Frequency Identification (RFID) communication, mobile telecommunication, memory card communication, or Universal Serial Bus (USB) communication. For example, the connectivity unit 1920 may include a baseband chipset and support communication standards such as GSM, GRPS, WCDMA, or HSxPA.

The first memory device 1930, which is a volatile memory device, may store data processed by the application processor 1910 or operate as a working memory. The first memory device 1930 may include a plurality of memory cell rows, and a flag storage 1931, with respect to refresh row addresses, that stores a weak cell flag that indicates a weak cell row including at least one memory cell having a data retention time that is shorter than a refresh period and a strong cell flag that indicates a strong cell row including at least one memory cell having a data retention time that is longer than the refresh period. The first memory device 1930 may refresh the weak cell row according to a shorter period than the refresh period, refresh the strong cell row according to a longer period than the refresh period, and refresh normal cell rows, which are memory cell rows other than the weak cell row and the strong cell row, according to the refresh period.

The second memory device 1940, which is a non-volatile memory device, may store a boot image for booting the mobile system 1900. For example, the second memory device 1940 may be provided as electrically erasable programmable read-only memory (EEPROM), flash memory, phase change random access memory (PRAM), resistance random access memory (RRAM), nano-floating gate memory (NFGM), polymer random access memory (PoRAM), magnetic random access memory (MRAM), ferroelectric random access memory (FRAM), or the like.

The user interface 1950 may include at least one input device, such as a keypad or a touch screen, and/or at least one output device, such as a speaker or a display device. A driving voltage may be applied to the power supply 1960. Also, according to an embodiment, the mobile system 1900 may further include a camera image processor (CIP), and a storage device, such as a memory card, a solid state drive (SSD), a hard disk drive (HDD), or a CD-ROM.

Figure 17:
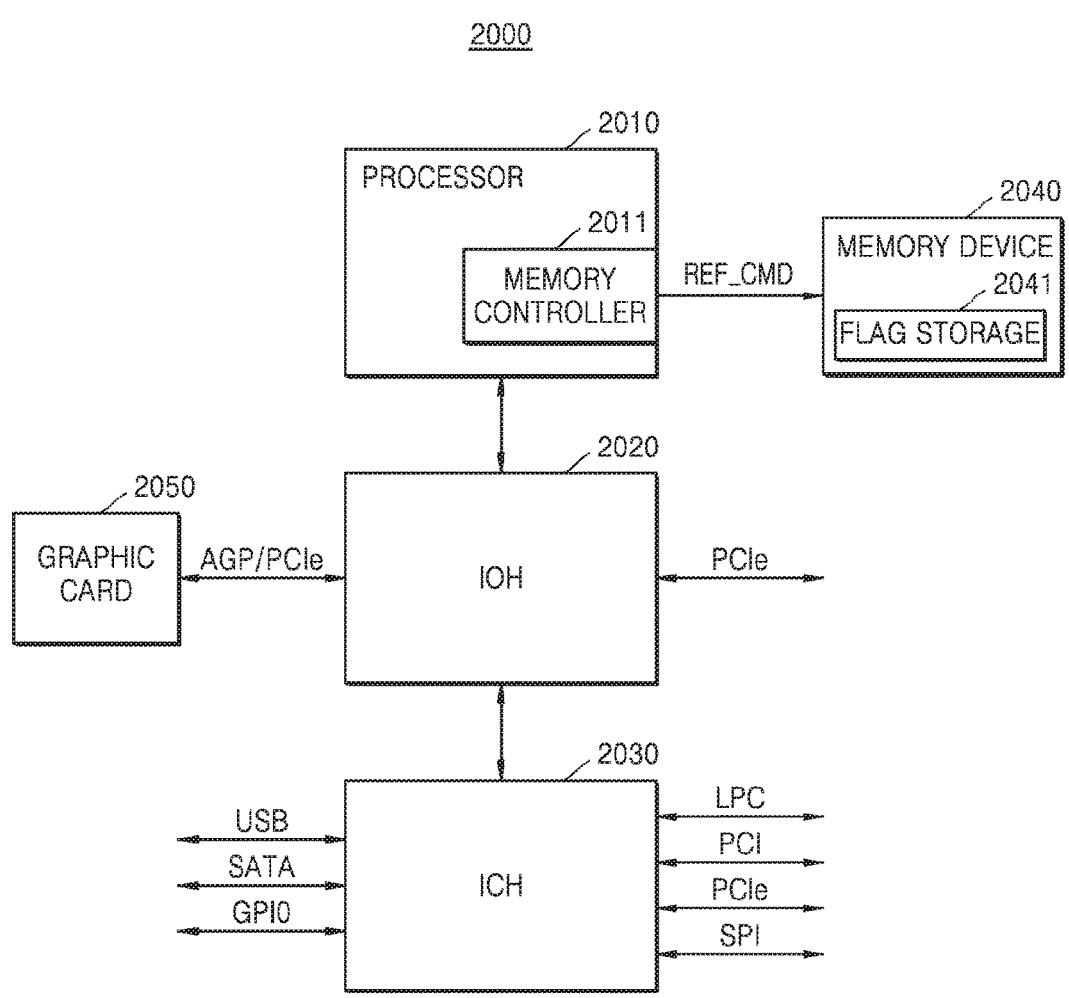
FIG. 17 is a block diagram illustrating a computing system to which a memory device performing a refresh operation by using a cell characteristic flag, according to at least some example embodiments of the inventive concepts, is applied.

FIG. 17 is a block diagram illustrating a computing system 2000 to which a memory device 2040 performing a refresh operation by using a cell characteristic flag, according to at least some example embodiments of the inventive concepts, is applied.

Referring to FIG. 17, the computing system 2000 includes a processor 2010, an I/O hub 2020, an I/O controller hub 2030, the memory device 2040, and a graphic card 2050. According to an embodiment, the computing system 2000 may be any computing system, including, for example, a personal computer (PC), a server computer, a workstation, a laptop, a mobile phone, a smart phone, a PDA, a PMP, a digital camera, a digital TV, a set-top box, a music player, a portable game console, or a navigation system.

The processor 2010 may perform various computing functions, such as calculations or tasks. For example, the processor 2010 may be a microprocessor or a central processing unit (CPU). According to an embodiment, the processor 2010 may include a single core or multiple cores. For example, the processor 2010 may include dual-core, quad-core, or hexa-core processors. Also, although FIG. 17 illustrates that the computing system 2000 includes only one processor, according to at least some example embodiments of the inventive concepts, the computing system 2000 may include a plurality of processors. Also, according to at least some example embodiments of the inventive concepts, the processor 2010 may further include an internal or external cache memory.

The processor 2010 may include a memory controller 2011 that controls operations of the memory device 2040. The memory controller 2011 included in the processor 2010 may be referred to as an integrated memory controller (IMC). According to an embodiment, the memory controller 2011 may be located in the I/O hub 2020. The I/O hub 2020 that includes the memory controller 2011 may be referred to as a memory controller hub (MCH).

The first memory device 2040 may include a plurality of memory cell rows, and a flag storage 2041 that stores, with respect to refresh row addresses, a weak cell flag that indicates a weak cell row including at least one memory cell having a data retention time that is shorter than a refresh period and a strong cell flag that indicates a strong cell row including at least one memory cell having a data retention time that is longer than the refresh period. The first memory device 2040 may refresh the weak cell row according to a shorter period than the refresh period, refresh the strong cell row according to a longer period than the refresh period, and refresh normal cell rows, which are memory cell rows other than the weak cell row and the strong cell row, according to the refresh period.

The I/O hub 2020 may manage data transmission between devices, such as the graphic card 2050, and the processor 2010. The I/O hub 2020 may be connected to the processor 2010 via various types of interfaces. For example, the I/O hub 2020 and the processor 2010 may be connected via various standards of interfaces, for example, Front Side Bus (FSB), system bus, HyperTransport, Lightning Data Transport (LDT), QuickPath Interconnect (QPI), Common System Interface (CSI), or Peripheral Component Interface Express (PCIe) interface. Although FIG. 17 illustrates that the computing system 2000 includes only one I/O hub, according to at least some example embodiments of the inventive concepts, the computing system 2000 may include a plurality of I/O hubs.

The I/O hub 2020 may provide an interface for various devices. For example, the I/O hub 2020 may provide an Accelerated Graphics Port (AGP) interface, a PCIe interface, or a Communication Streaming Architecture (CSA) interface.

The graphic card 2050 may be connected to the I/O hub 2020 via AGP or PCIe. The graphic card 2050 may control a display device (not shown) for displaying images. The graphic card 2050 may include an internal processor for processing image data and an internal semiconductor memory device. According to at least one example embodiment of the inventive concepts, the I/O hub 2020 may include a graphics device therein together with or instead of the graphic card 2050 disposed outside the I/O hub 2020. The graphics device included in the I/O hub 2020 may be referred to as integrated graphics. Also, the I/O hub 2020 that includes the memory controller and the graphics device may be referred to as a Graphics and Memory Controller Hub (GMCH).

The I/O controller hub 2030 may perform data buffering and interface arbitration so that various system interfaces operate efficiently. The I/O controller hub 2030 may be connected to the I/O hub 2020 via an internal bus. For example, the I/O hub 2020 and the I/O controller hub 2030 may be connected via Direct Media Interface (DMI), hub interface, Enterprise Southbridge interface (ESI), or PCIe.

The I/O controller hub 2030 may provide various interfaces for peripheral devices. For example, the I/O controller hub 2030 may provide a USB port, a Serial Advanced Technology Attachment (SATA) port, a general purpose input/output (GPIO) port, a Low Pin Count (LPC) bus, a Serial Peripheral Interface (SPI), a PCI interface, or a PCIe interface.

According to at least one example embodiment of the inventive concepts, at least two selected from the processor 2010, the I/O hub 2020, and the I/O controller hub 2030 may be formed as a single chipset.

Example embodiments of the inventive concepts having thus been described, it will be obvious that the same may be varied in many ways. Such variations are not to be regarded as a departure from the intended spirit and scope of example embodiments of the inventive concepts, and all such modifications as would be obvious to one skilled in the art are intended to be included within the scope of the following claims.

What is claimed is:

1. A memory device comprising:
a memory cell array including a plurality of memory cell rows; and
a refresh address generator configured to perform a refresh operation, the refresh address generator includes,
a refresh counter configured to perform a count operation based on a refresh command and to generate refresh row addresses respectively corresponding to the plurality of memory cell rows;
a flag storage including a plurality of storage cells arranged in rows and columns, the plurality of storage cells being configured to store flags respectively corresponding to the plurality of memory cell rows, each of the flags indicating a type of a memory cell row corresponding to the flag from among the plurality of memory cell rows;
a row decoder coupled to the flag storage and configured to receive bits of a first group of the refresh row addresses and to access storage cell rows of the flag storage by decoding the bits of the first group of the refresh row addresses; and
a column decoder coupled to the flag storage and configured to receive bits of a second group of the refresh row addresses and to access storage cell columns of the flag storage by decoding the bits of the second group of the refresh row addresses.

2. The memory device of claim 1, wherein the storage cells are non-volatile memory and include at least one of electrically programmable fuse memory, laser-programmable fuse memory, anti-fuse memory, one-time programmable memory, or flash memory.

3. The memory device of claim 1, wherein the refresh address generator further includes a sense amplifier coupled to the flag storage and configured to receive bits of a third group of the refresh row addresses and select one of the storage cell columns activated by the column decoder, the bits of the first, second, and third groups of the refresh row addresses being different from each other.

4. The memory device of claim 1, wherein the plurality of memory cell rows includes one or more weak cell rows having at least one weak cell, the at least one weak cell has a data retention time that is shorter than a refresh period, and each of the flags to which the one or more weak cell rows correspond is a weak cell flag.

5. The memory device of claim 4, wherein the refresh address generator is configured to refresh the one or more weak cell rows according to a period that is shorter than the refresh period based on the weak cell flag.

6. The memory device of claim 1, wherein the plurality of memory cell rows includes one or more strong cell rows having at least one strong cell, the at least one strong cell has a data retention time that is longer than a refresh period, and each of the flags to which the one or more strong cell rows correspond is a strong cell flag.

7. The memory device of claim 6, wherein the refresh address generator is configured to refresh the one or more strong cell rows according to a period that is longer than the refresh period based on the strong cell flag.

8. The memory device of claim 1, wherein the plurality of memory cell rows includes one or more normal cell rows not having a weak cell or a strong cell, and each of the flags to which the one or more normal cell rows correspond is a normal cell flag.

9. The memory device of claim 8, wherein the refresh address generator is configured to refresh the one or more normal cell rows according to a refresh period based on the normal cell flag.

10. The memory device of claim 1, wherein the plurality of storage cells are configured to store the flags before the memory device is packaged.

11. The memory device of claim 1, wherein the plurality of storage cells are configured to store the flags after the memory device is packaged.

12. A refresh method of a memory device, the method comprising:
receiving a refresh command;
performing a count operation to generate refresh row addresses respectively corresponding to a plurality of memory cell rows of a memory cell array based on the refresh command;
storing, in a plurality of storage cells of a flag storage, flags that respectively correspond to the refresh row addresses, the plurality of storage cells arranged in rows and columns of the flag storage, each of the flags indicating a type of a memory cell row corresponding to the flag from among the plurality of memory cell rows;
accessing a storage cell row of the flag storage by using bits of a first group of the refresh row addresses;
accessing storage cell columns of the flag storage by using bits of a second group of the refresh row addresses;
selecting one of the accessed storage cell columns by using bits of a third group of the refresh row addresses;
reading a first flag stored in a first storage cell to which the accessed storage cell row and the selected storage cell column correspond among the plurality of storage cells; and
refreshing a memory cell row corresponding to the refresh row addresses based on the first flag,
wherein the bits of the first, second, and third groups of the refresh row address are different from each other.

13. The method of claim 12, wherein the storing of the flags comprises storing a weak cell flag, the weak cell flag corresponding to one or more weak cell rows among the plurality of memory cell rows.

14. The method of claim 13, wherein the refreshing of the memory cell row comprises refreshing the one or more weak cell rows according to a period that is shorter than a refresh period based on the weak cell flag.

15. The method of claim 12, wherein the storing of the flags comprises storing a strong cell flag, the strong cell flag corresponding to one or more strong cell rows among the plurality of memory cell rows.

16. The method of claim 15, wherein the refreshing of the memory cell row comprises refreshing the one or more strong cell rows according to a period that is longer than a refresh period based on the strong cell flag.

17. The method of claim 12, wherein the storing of the flags comprises storing a normal cell flag, the normal cell flag corresponding to one or more normal cell rows not having a weak cell or a strong cell among the plurality of memory cell rows.

18. The method of claim 17, wherein the refreshing of the memory cell row comprises refreshing the one or more normal cell rows according to a refresh period based on the normal cell flag.

19. A memory system comprising:
a memory controller transmitting a refresh command; and
a memory device communicatively coupled to the memory controller, the memory device including
a memory cell array including a plurality of memory cell rows;
a refresh counter configured to perform a count operation based on the refresh command and to generate refresh row addresses respectively corresponding to the plurality of memory cell rows;
a flag storage including a plurality of storage cells arranged in rows and columns, the plurality of storage cells being configured to store flags respectively corresponding to the plurality of memory cell rows, each of the flags indicating a type of a memory cell row corresponding to the flag from among the plurality of memory cell rows;
a decoder coupled to the flag storage and configured to access a storage cell row and a storage cell column of the flag storage based on the refresh row addresses; and
a sense amplifier coupled to the flag storage and configured to select a storage cell to which the accessed storage cell row and the accessed storage cell column correspond from among the plurality of storage cells.

20. The memory system of claim 19, wherein the memory device is configured to perform a refresh operation of a memory cell row corresponding to the refresh row addresses based on a flag stored in the selected storage cell, the flag being a normal cell flag, a weak cell flag or a strong cell flag.

* * * * *